(12) United States Patent
Park

(10) Patent No.: US 12,421,996 B2
(45) Date of Patent: Sep. 23, 2025

(54) LINK HINGE STRUCTURE AND ELECTRONIC DEVICE COMPRISING SAME

(71) Applicant: SAMSUNG ELECTRONICS CO., LTD., Suwon-si (KR)

(72) Inventor: Daehyeong Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 331 days.

(21) Appl. No.: 18/110,103

(22) Filed: Feb. 15, 2023

(65) Prior Publication Data

US 2023/0193947 A1    Jun. 22, 2023

Related U.S. Application Data

(63) Continuation of application No. PCT/KR2021/009334, filed on Jul. 20, 2021.

(30) Foreign Application Priority Data

Sep. 14, 2020    (KR) .................. 10-2020-0117607

(51) Int. Cl.
*G06F 1/16* (2006.01)
*F16C 11/04* (2006.01)
(Continued)

(52) U.S. Cl.
CPC ............ F16C 11/04 (2013.01); G06F 1/1616 (2013.01); G06F 1/1681 (2013.01);
(Continued)

(58) Field of Classification Search
CPC ... H05K 5/0226; G06F 1/1616; G06F 1/1681; F16C 11/04; E05Y 2999/00; E05D 3/122
See application file for complete search history.

(56) References Cited

U.S. PATENT DOCUMENTS 5,570,971 A * 11/1996 Rixen ................. G09F 15/0068
52/592.4
7,512,426 B2    3/2009 Maatta et al.
(Continued)

FOREIGN PATENT DOCUMENTS

CN         111649056       9/2020
KR      10-2017-0018909    2/2017
(Continued)

OTHER PUBLICATIONS

Extended European Search Report dated Oct. 18, 2023 for EP Application No. 21866986.9.

*Primary Examiner* — Imani N Hayman
*Assistant Examiner* — Rashen E Morrison
(74) *Attorney, Agent, or Firm* — Nixon & Vanderhye P.C.

(57) ABSTRACT

A hinge structure may include at least some of: a first rotary bar, a second rotary bar, a first interlocking gear bar and a second interlocking gear bar, a first support bar and a second support bar, a third interlocking gear bar and a fourth interlocking gear bar, a third support bar and a fourth support bar, a first fixing shaft, a second fixing shaft, a third fixing shaft, a fourth fixing shaft, a first connection shaft, a second connection shaft, a third connection shaft, and a fourth connection shaft, wherein each of the third fixing shaft and the fourth fixing shaft may include a column part, and rail bosses protruding from an outer peripheral surface of the column part, and each of the first interlocking gear bar and the second interlocking gear bar may include a first shaft insertion hole for insertion of the third fixing shaft, and a first hole extension part extending from the first shaft, and into which a first rail boss formed in the third fixing shaft is to be inserted.

20 Claims, 11 Drawing Sheets

(51) Int. Cl.
*H05K 5/02* (2006.01)
*E05D 3/12* (2006.01)

(52) U.S. Cl.
CPC .......... *H05K 5/0226* (2013.01); *E05D 3/122* (2013.01); *E05Y 2999/00* (2024.05)

(56) References Cited

U.S. PATENT DOCUMENTS

| | | | | |
|---|---|---|---|---|
| 8,720,011 | B1 * | 5/2014 | Hsu | ........................ G06F 1/1681 |
| | | | | 16/354 |
| 9,786,207 | B2 * | 10/2017 | Kim | ........................ G09F 9/301 |
| 9,848,502 | B1 * | 12/2017 | Chu | ........................ G06F 1/1681 |
| 10,032,391 | B2 * | 7/2018 | Kim | ........................ G06F 1/1641 |
| 10,037,058 | B2 | 7/2018 | Kato | |
| 10,073,496 | B2 * | 9/2018 | Chen | ........................ G06F 1/1681 |
| 10,244,653 | B2 * | 3/2019 | Hsu | ........................ H05K 7/16 |
| 10,401,917 | B1 * | 9/2019 | Dai | ........................ G06F 1/1679 |
| 10,503,210 | B2 | 12/2019 | Lee et al. | |
| 10,599,189 | B1 * | 3/2020 | Hsu | ........................ G06F 1/1681 |
| 10,761,573 | B2 | 9/2020 | Hsu | |
| 10,802,551 | B1 * | 10/2020 | Lin | ........................ E05D 3/122 |
| 10,890,951 | B1 * | 1/2021 | Watamura | ........................ G06F 1/1681 |
| 10,975,603 | B2 | 4/2021 | Tazbaz | |
| 11,016,530 | B2 * | 5/2021 | Watamura | ........................ G06F 1/1652 |
| 11,019,742 | B2 | 5/2021 | Hsu et al. | |
| 11,181,951 | B1 * | 11/2021 | Ushioda | ........................ G06F 1/1616 |
| 11,379,013 | B2 | 7/2022 | Cha et al. | |
| 11,573,610 | B2 * | 2/2023 | Hsu | ........................ G06F 1/1681 |
| 11,579,661 | B2 * | 2/2023 | Kinoshita | ........................ G06F 1/1681 |
| 11,762,430 | B2 * | 9/2023 | Kim | ........................ G06F 1/1616 |
| | | | | 361/679.27 |
| 11,841,748 | B2 * | 12/2023 | Lin | ........................ G06F 1/1681 |
| 11,889,645 | B2 * | 1/2024 | Sun | ........................ E05D 3/18 |
| 2006/0238968 | A1 | 10/2006 | Maatta et al. | |
| 2014/0174226 | A1 * | 6/2014 | Hsu | ........................ G06F 1/1681 |
| | | | | 74/98 |
| 2015/0361696 | A1 | 12/2015 | Tazbaz | |
| 2018/0059740 | A1 | 3/2018 | Kato | |
| 2018/0150107 | A1 | 5/2018 | Lee et al. | |
| 2018/0275725 | A1 * | 9/2018 | Lin | ........................ H04M 1/0268 |
| 2019/0274227 | A1 | 9/2019 | Hsu et al. | |
| 2020/0103935 | A1 | 4/2020 | Hsu | |
| 2020/0392983 | A1 * | 12/2020 | Chang | ........................ F16C 11/04 |
| 2020/0409422 | A1 | 12/2020 | Wang et al. | |
| 2020/0409431 | A1 | 12/2020 | Fan | |
| 2020/0413557 | A1 | 12/2020 | Zhang | |
| 2021/0011514 | A1 | 1/2021 | Wang et al. | |
| 2021/0011522 | A1 * | 1/2021 | Watamura | ........................ G06F 1/1681 |
| 2021/0037664 | A1 * | 2/2021 | Sun | ........................ E05D 3/18 |
| 2021/0199153 | A1 * | 7/2021 | Hsu | ........................ G06F 1/1681 |
| 2021/0207648 | A1 * | 7/2021 | Chen | ........................ H04M 1/022 |
| 2021/0365073 | A1 | 11/2021 | Cha et al. | |
| 2022/0121245 | A1 * | 4/2022 | Huang | ........................ H04M 1/022 |

FOREIGN PATENT DOCUMENTS

| | | |
|---|---|---|
| KR | 10-2017-0136907 | 12/2017 |
| KR | 10-2018-0062277 | 6/2018 |
| KR | 10-2018-0138494 | 12/2018 |
| KR | 10-2020-0117777 | 10/2020 |
| KR | 10-2298726 | 9/2021 |
| KR | 10-2021-0150583 | 12/2021 |
| WO | 2019/174219 | 9/2019 |
| WO | 2021/235569 | 11/2021 |

\* cited by examiner

# LINK HINGE STRUCTURE AND ELECTRONIC DEVICE COMPRISING SAME

CROSS-REFERENCE TO RELATED APPLICATIONS

This application is a continuation of International Application No. PCT/KR2021/009334, filed on Jul. 20, 2021, designating the U.S., in the Korean Intellectual Property Receiving Office, and claiming priority to KR 10-2020-0117607 filed on Sep. 14, 2020, the disclosures of which are all hereby incorporated by reference herein in their entireties.

BACKGROUND

Field

Various embodiments relate to an electronic device including a link hinge structure.

Description of Related Art

A portable electronic device, such as a smartphone, may provide various functions, such as voice communication, playback of videos, and search through the internet, based on various kinds of applications. The user may intend to use the above-mentioned functions through a wider screen. However, as the screen becomes larger, portability may deteriorate. Accordingly, a foldable portable electronic device that may increase portability by utilizing a folded structure has been developed.

SUMMARY

A foldable electronic device may be configured such that hinge structures and housing structures that are adjacent to the hinge structures are connected to each other and the housing structures are rotated at a specific angle while the hinge structures support the hinge structures. Various structures need to be disposed to support hinge operations of the housing structures. For example because the hinge structure are disposed such that a plurality of gears are connected to each other, there is a high danger of damage when an impact is applied thereto.

Various example embodiments provide a link hinge structure, and an electronic device including the same.

A link hinge structure according to various example embodiments may include one or more of: a first rotary bar connected to, directly or indirectly, a first rotary member, a second rotary bar connected to, directly or indirectly, a second rotary member, a first interlocking gear bar and a second interlocking gear bar coupled to the first rotary bar and each including an interlocking gear structure, a first support bar and a second support bar connected to, directly or indirectly, the first rotary bar and that supports rotation of the first rotary bar, a third interlocking gear bar and a fourth interlocking gear bar coupled to the second rotary bar and each including an interlocking gear structure, wherein the third interlocking gear bar is coupled to the first interlocking gear bar and the fourth interlocking gear bar is coupled to the second interlocking gear bar, a third support bar and a fourth support bar connected to, directly or indirectly, the second rotary bar 2 and that supports rotation of the second rotary bar, a first fixing shaft that fixes the first support bar and the second support bar, a second fixing shaft that fixes the third support bar and the fourth support bar, a third fixing shaft that fixes the first interlocking gear bar and the second interlocking gear bar, a fourth fixing shaft that fixes the third interlocking gear bar and the fourth interlocking gear bar, a first connection shaft connecting the first support bar and the first rotary bar, and the second support bar and the first rotary bar, a second connection shaft connecting the third support bar and the second rotary bar, and the fourth support bar and the second rotary bar, a third connection shaft connecting the first rotary bar and the first interlocking gear bar, and the first rotary bar and the second interlocking gear bar, and a fourth connection shaft connecting the second rotary bar and the third interlocking gear bar, and the second rotary bar and the fourth interlocking gear bar, each of the third fixing shaft and the fourth fixing shaft may include a column part, and rail bosses protruding from an outer peripheral surface of the column part, and each of the first interlocking gear bar and the second interlocking gear bar may include a first shaft insertion hole for insertion of the third fixing shaft, and a first hole extension part extending from the first shaft insertion hole and into which a first rail boss formed in the third fixing shaft is inserted.

An electronic device according to various example embodiments may include a display, a first housing that supports one side of the display, a second housing that supports an opposite side of the display, and a link hinge structure connecting the first housing and the second housing, the link hinge structure includes a first rotary bar connected to, directly or indirectly, a first rotary member, a second rotary bar connected to, directly or indirectly, a second rotary member, a first interlocking gear bar and a second interlocking gear bar coupled to the first rotary bar and each including an interlocking gear structure, a first support bar and a second support bar connected to, directly or indirectly, the first rotary bar and that supports rotation of the first rotary bar, a third interlocking gear bar and a fourth interlocking gear bar coupled to the second rotary bar and each including an interlocking gear structure, wherein the third interlocking gear bar is coupled to the first interlocking gear bar and the fourth interlocking gear bar is coupled to the second interlocking gear bar, a third support bar and a fourth support bar connected to, directly or indirectly, the second rotary bar and that supports rotation of the second rotary bar, a first fixing shaft that fixes the first support bar and the second support bar, a second fixing shaft that fixes the third support bar and the fourth support bar, a third fixing shaft that fixes the first interlocking gear bar and the second interlocking gear bar, a fourth fixing shaft that fixes the third interlocking gear bar and the fourth interlocking gear bar, a first connection shaft connecting the first support bar and the first rotary bar, and the second support bar and the first rotary bar, a second connection shaft connecting the third support bar and the second rotary bar, and the fourth support bar and the second rotary bar, a third connection shaft connecting the first rotary bar and the first interlocking gear bar, and the first rotary bar and the second interlocking gear bar, and a fourth connection shaft connecting the second rotary bar and the third interlocking gear bar, and the second rotary bar and the fourth interlocking gear bar, each of the third fixing shaft and the fourth fixing shaft may include a column part, and rail bosses protruding from an outer peripheral surface of the column part, each of the first interlocking gear bar and the second interlocking gear bar may include a first shaft insertion hole for insertion of the third fixing shaft, and a first hole extension part extending from the first shaft insertion hole and into which a first rail boss formed in the third fixing shaft is inserted, and each of the third interlocking gear bar and the fourth interlocking gear bar may include a second shaft insertion hole for insertion of the fourth fixing shaft, and a second hole extension part extending from the second shaft insertion hole and into which a second rail boss formed in the fourth fixing shaft is inserted.

According to a link hinge structure and an electronic device including the same according to various example embodiments, there may be provided a device that may be robust to damage, may be easily manufactured, and/or may be easily repaired by implementing the hinge structure based on a relatively small number of components.

Other various purposes and effects provided by the hinge structure and the electronic device including the same according to various embodiments may be mentioned according to the embodiments of the detailed description.

BRIEF DESCRIPTION OF THE DRAWINGS

The above and other aspects, features, and advantages of certain example embodiments of the present disclosure will be more apparent from the following detailed description, taken in conjunction with the accompanying drawings, in which.

DETAILED DESCRIPTION

Figure 1:
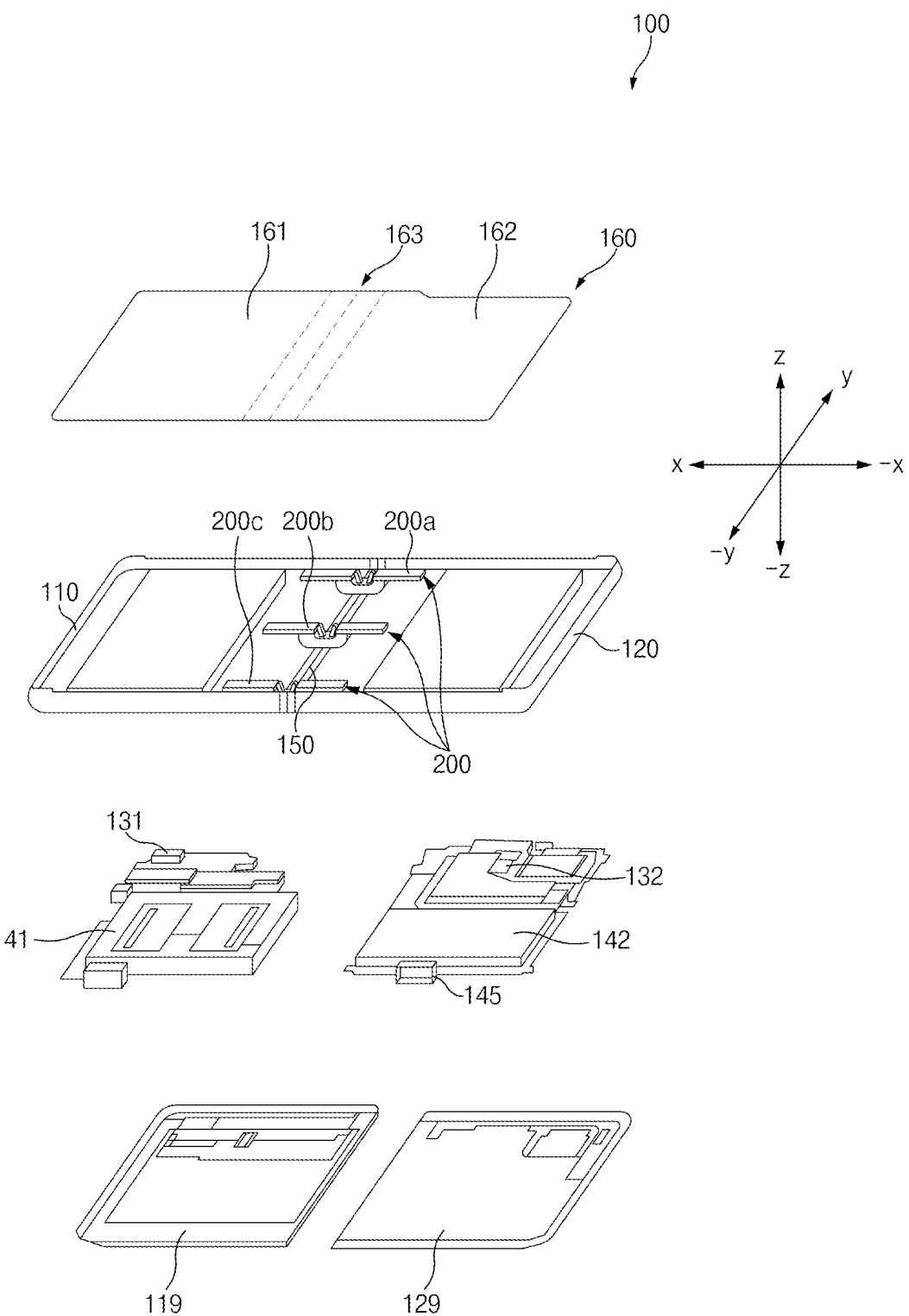
FIG. 1 is a view illustrating an example of an exploded perspective view of an electronic device according to various example embodiments.

Hereinafter, various embodiments of the disclosure will be described with reference to the accompanying drawings. Accordingly, those of ordinary skill in the art will recognize that modification, equivalent, and/or alternative on the various embodiments described herein can be variously made without departing from the description and spirit of the disclosure. With regard to the description of drawings, similar components may be denoted by similar reference numerals.

In the disclosure disclosed herein, the expressions "have", "may have", "include" and "comprise", or "may include" and "may comprise" used herein indicate existence of corresponding features (e.g., components such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various components of various embodiments of the disclosure, but do not limit the components. For example, such terms are used only to distinguish a component from another component and do not limit the order and/or priority of the components. For example, a first user device and a second user device may represent different user devices irrespective of sequence or importance. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it can be directly coupled with/to or connected to the other component or an intervening component(s) (e.g., via at least a third component) may be present. In contrast, when an component (e.g., a first component) is referred to as being "directly coupled with/to" or "directly connected to" another component (e.g., a second component), it should be understood that there is no intervening component (e.g., a third component).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used in this specification are used to describe specified embodiments of the disclosure and are not intended to limit the scope of the disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal meaning unless expressly so defined herein in various embodiments of the disclosure. According to occasions, even a term defined in the disclosure cannot be construed to exclude the embodiments of the disclosure.

An electronic device according to various embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the disclosure, the wearable devices may include accessories (e.g., watches, rings, bracelets, ankle bracelets, glasses, contact lenses, or head-mounted devices (HMDs)), cloth-integrated types (e.g., electronic clothes), body-attached types (e.g., skin pads or tattoos), or implantable types (e.g., implantable circuits).

Figure 2:
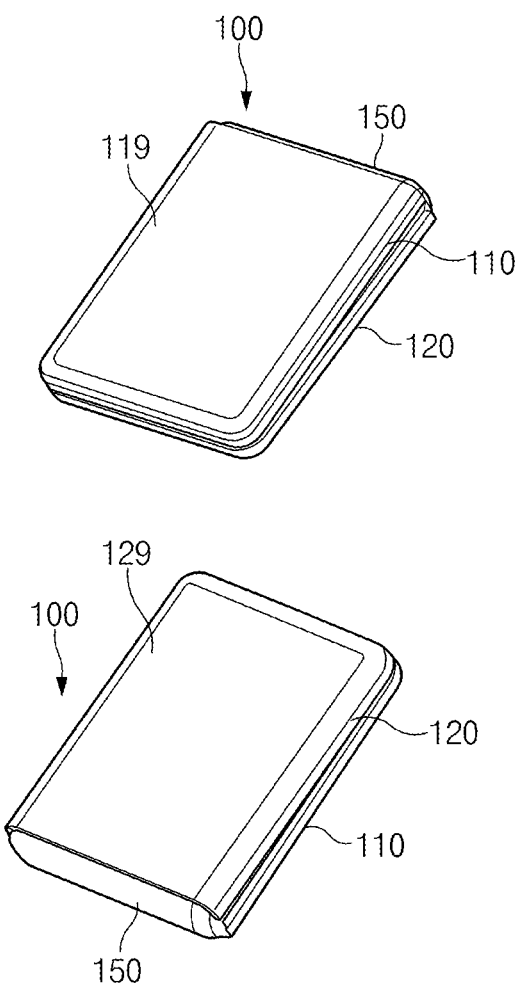
FIG. 2 is a view illustrating an example of a folded state of an electronic device according to various example embodiments.

Hereinafter, electronic devices according to an embodiment of the disclosure will be described with reference to the accompanying drawings. The term "user" used herein may refer to a person who uses an electronic device or may refer to a device (e.g., an artificial electronic device) that uses an electronic device FIG. 1 is a view illustrating an example of an exploded perspective view of an electronic device according to various embodiments. FIG. 2 is a view illustrating an example of a folded state of an electronic device according to various embodiments.

Referring to FIGS. 1 and 2, an electronic device 100 (e.g., a foldable electronic device) according to an embodiment may include a display 160 (e.g., a flexible display), a first housing 110 and a second housing 120, a link hinge structure 200 (or 200a, 200b, and 200c), and a hinge housing 150, inside which at least a portion of the link hinge structure 200 is disposed. FIG. 1 illustrates an exploded perspective view of a first state (e.g., a flat state, an unfolding state, or an unfolded state) of the electronic device 100, and FIG. 2 is a perspective view in a state (e.g., a folded state or a folding state of the electronic device 100. Additionally or alternatively, the electronic device 100 may further include a first cover 119 that covers a rear surface of the first housing 110, a second cover 129 that covers a rear surface of the second housing 120, a first printed circuit board 131 and a second printed circuit board 132, in which electronic elements related to driving of the display 160 are disposed, and a first battery 141 and a second battery 142. According to various embodiments, the electronic device 100 may include only one battery.

According to various embodiments, the first housing 110 may be disposed to be continuous to the second housing 120 (e.g., when a central portion 163 of the display 160 is spread flatly or the housing 110, 120 is in the unfolded state), or may be disposed in parallel to the second housing 120. Furthermore, when the central portion 163 of the display 160 is folded, one surface of the first housing 110 may be disposed to face one surface of the second housing 120.

According to an embodiment, the first housing 110, for example, may be configured such that at least a portion thereof is formed of a metallic material or at least a portion thereof is formed of a nonmetallic material. For example, the first housing 110 may be formed of a material having a specific strength to support at least a portion of the display 160. One area (e.g., at least a portion of an upper portion 161 and the central portion 163 of the display 160) of the display 160 may be disposed at at least a portion of a front surface of the first housing 110. Furthermore, at least a portion of the first housing 110 may be bonded to the upper portion 161 of the display 160. Furthermore, at least a portion of a periphery of the front surface of the first housing 110 may be bonded to a periphery of the upper portion 161 of the display 160. Furthermore, one side of the upper portion 161 of the display 160 may be bonded to one side of an upper portion of the front surface of the first housing 110. In this regard, a bonding layer may be disposed at at least a portion between the first housing 110 and the upper portion 161 of the display 160. At least a portion of the inside of the first housing 110 may be provided such that the interior thereof is empty or may be provided such that the interior thereof is empty after the first housing 110 is coupled to the first cover 119 such that an electronic element (e.g., an element, such as the first printed circuit board 131, at least one processor mounted on the first printed circuit board 131, at least one memory, or a battery) that is necessary for driving the display 160, and the first battery 141 may be disposed.

According to various embodiments, ends (e.g., at least a portion of ends of the remaining three peripheries except for a periphery that faces the second housing 120) of the first housing 110 may protrude by a specific height further than a bottom surface of a central portion of the housing to surround a periphery of at least one side of the display 160. Furthermore, side walls, at least portions of which face a periphery of the display 160, may be disposed at at least a portion of the periphery end of the first housing 110. Side walls formed at at least a portion of a periphery of the first housing 110 may have specific heights at the remaining three peripheries, except for the periphery that faces the second housing 120. A peripheral portion of the first housing 110, which faces the second housing 120, may include a recessed part, at least a portion of which has a specific curvature such that at least a portion of the hinge housing 150 is disposed.

According to various embodiments, the second housing 120, according to disposition thereof, may be disposed in parallel to the first housing 110 or may be disposed such that at least one surface thereof faces one surface (e.g., a surface on which the display 160 is disposed) of the first housing 110. The second housing 120 may be formed of the same material as the first housing 110. Because the second housing 120 is disposed to be symmetrical to the first housing 110 leftwards and rightwards or upwards and downwards, at least a portion (e.g., the lower portion 162 of the display 160 and an opposite side of the central portion 163) of the remaining area of the display 160, except for the area disposed in the first housing 110, may be disposed to be supported by a front surface of the second housing 120. Furthermore, at least a portion of the second housing 120 may be bonded to the lower portion 162 of the display 160. Furthermore, a periphery of the front surface of the second housing 120 may be bonded to a periphery of the lower portion 162 of the display 160. Furthermore, one side of the lower portion 162 of the display 160 may be bonded to one side of a lower portion of the front surface of the second housing 120. In this regard, a bonding layer may be disposed at at least a portion between the second housing 120 and the lower portion 162 of the display 160. At least a portion of an inside of the second housing 120 may be provided in an empty shape similarly to the first housing 110 or provided in an empty shape while being coupled to the second cover 129 whereby the electronic elements (e.g., the second printed circuit board 132, the processor, the memory, and the camera mounted on or electrically connected to the second printed circuit board 132), and the second battery 142) that are necessary for driving of the display 160 and the second battery 142 may be disposed therein. According to various embodiments, a USB connector 145 may be electrically connected on one side of the second printed circuit board 132 or may be mounted on the second printed circuit board 132.

According to various embodiments, ends (e.g., at least one of ends of the remaining three peripheries except for a periphery that faces the first housing 110) of the second housing 120 may protrude by a specific height further than a bottom surface of a central portion of the second housing 120 to surround a periphery of an opposite side of the display 160. Furthermore, similarly to the side walls formed in the first housing 120, side walls, at least portions of which face the periphery of the display 160, may be disposed at at least a portion of the peripheral end of the second housing 120. Side walls formed at at least a portion of a periphery of the second housing 120 may have specific heights at the remaining three peripheries, except for the periphery that faces the first housing 110. A portion of the second housing 120, which faces the first housing 110, may include a recessed part, at least a portion of which has a specific curvature such that the hinge housing 150 is disposed.

According to various embodiments, the electronic device 100 may include at least one sensor disposed on one side of the first housing 110 or the second housing 120 and related to management of a specific function of the electronic device 100. The sensor, for example, may include at least one of a proximity sensor, an illumination sensor, an iris sensor, an image sensor/camera, or a fingerprint sensor.

According to various embodiments, the hinge housing 150 may be covered by one side of the first housing 110 or the second housing 120 (e.g., an unfolded state of the housing 110, 120) or be exposed to the outside (e.g., a folded state of the housing 110, 120) according to the folded or unfolded state of the foldable electronic device 100. For example, as in FIG. 1, when the first housing 110 and the second housing 120 are disposed parallel to each other, the hinge housing 150 may be covered by the first housing 110 and the second housing 120. As in FIG. 2, when one surface of the first housing 110 and one surface of the second housing 120 are disposed to face each other, the hinge housing 150 may be disposed such that at least a portion thereof is exposed to the outside at peripheries (e.g., peripheries of the first housing 110 and the second housing 120, which face each other in the unfolded state) of one side of the first housing 110 and the second housing 120.

According to various embodiments, at least a portion of the display 160 may be flexible. According to an embodiment, the display 160 may include the upper portion 161 or a first area disposed on the first housing 110, the lower portion 162 or a second area disposed on the second housing 120, and the central portion 163 or a central area that are adjacent to the first housing 110 and the second housing 120. According to various embodiments, the entire display 160 may be flexible. Furthermore, at least a portion of the central portion 163 of the display 160 may be flexible. The central portion 163 of the display 160 may be disposed not to be bonded to the first housing 110 and the second housing 120. For example, the central portion 163 of the display 160 may be disposed to be spaced apart from the front surfaces of the first housing 110 and the second housing 120 by a specific interval. The upper portion 161 of the display 160 may be bonded to at least a portion of the first housing 110, and the lower portion 162 of the display 160 may be bonded to at least a portion of the second housing 120.

According to various embodiments, the link hinge structure 200 may connect the first housing 110 and the second housing 120, and may perform a hinge operation in correspondence to rotations of the first housing 110 and the second housing 120. At least one link hinge structure 200 may be disposed between the first housing 110 and the second housing 120, and the drawing exemplifies a state, in which the first to third link hinge structures 200a, 200b, and 200c are disposed. As another example, two or more link hinge structure 200 may be disposed. The link hinge structure 200 may include a plurality of link bars or link plates and a plurality of link shafts.

At least a portion of the first link hinge structure 200a may be disposed on one side of the hinge housing 150. With reference to the illustrated drawings, the first link hinge structure 200a may couple a right upper end of the first housing 110 and a left upper end of the second housing 120, and may be rotated within a specific range with reference to the y axis and the −y axis. The first link hinge structure 200a may be disposed to be symmetrical to the third link hinge structure 200c with respect to a central portion of the hinge housing 150.

The second link hinge structure 200b may be disposed at a center of the hinge housing 150. The second link hinge structure 200b may couple a center of the first housing 110 and a center of the second housing 120, and may be rotated within a specific range with reference to the y axis and the −y axis of the hinge housing 150. The second link hinge structure 200b may be hinged together with the first link hinge structure 200a and the third link hinge structure 200c. The second link hinge structure 200b may have a structure and a configuration that are the same as those of the first link hinge structure 200a, and a disposition location thereof may be different therefrom.

The third link hinge structure 200c may be disposed on an opposite side of the hinge housing 150. The third link hinge structure 200c may couple a right lower end of the first housing 110 and a left lower end of the second housing 120, and may be rotated within a specific range with reference to the y axis and the −y axis of the hinge housing 150. The third link hinge structure 200c may be disposed to be symmetrical to the first link hinge structure 200a with respect to the second link hinge structure 200b. The third link hinge structure 200c may have a structure and a configuration that are the same as those of the first link hinge structure 200a, and a disposition location thereof may be different therefrom.

Figure 3:
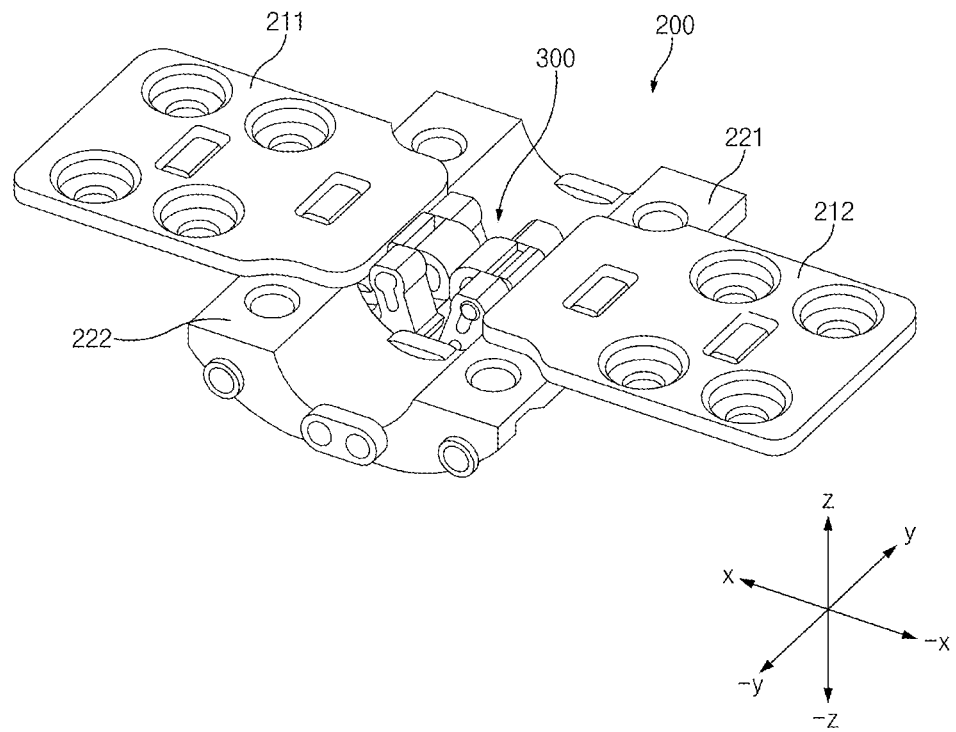
FIG. 3 is a view illustrating an example of an external appearance of a link hinge structure of an electronic device according to various example embodiments.
Figure 3:
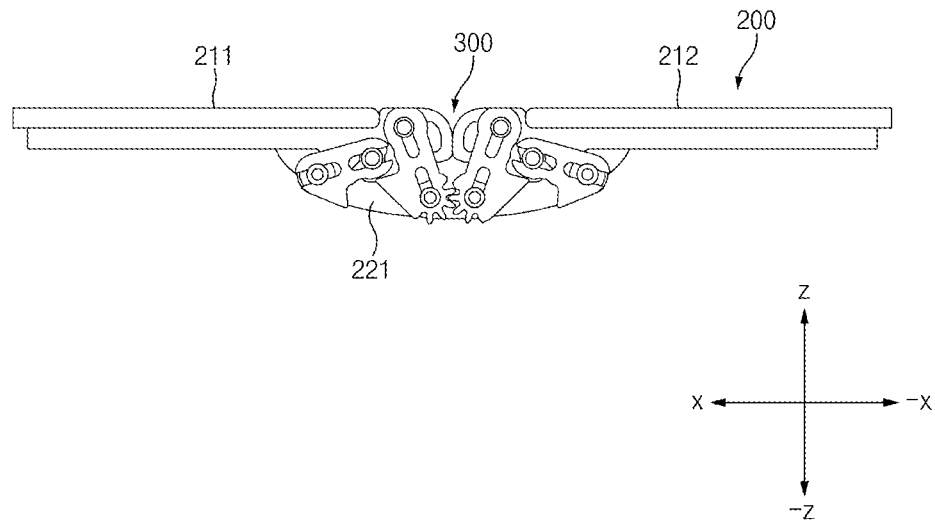
Figure 4:
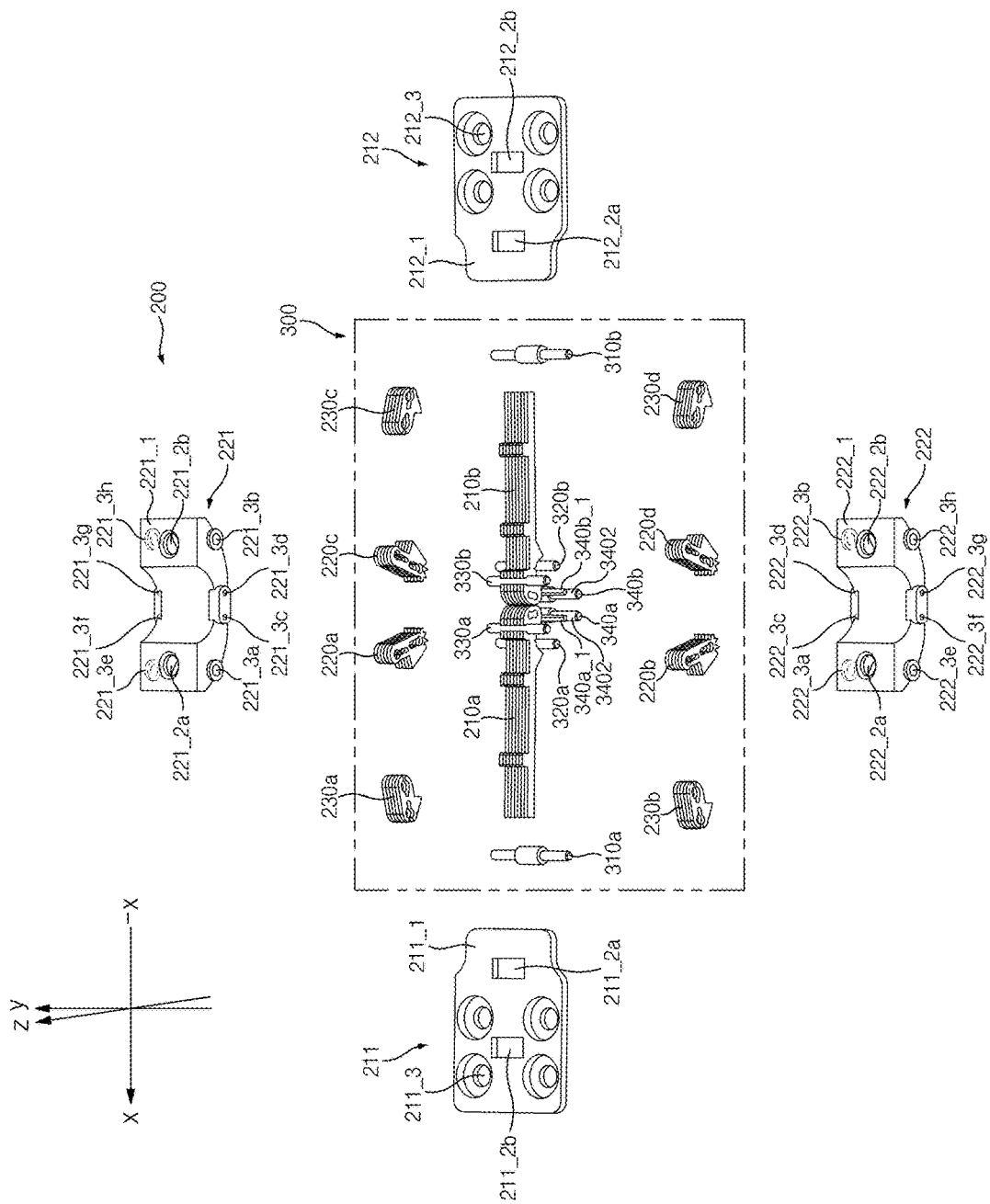
FIG. 4 is a view illustrating an example of an exploded perspective view of a link hinge structure according to an example embodiment.
Figure 5:
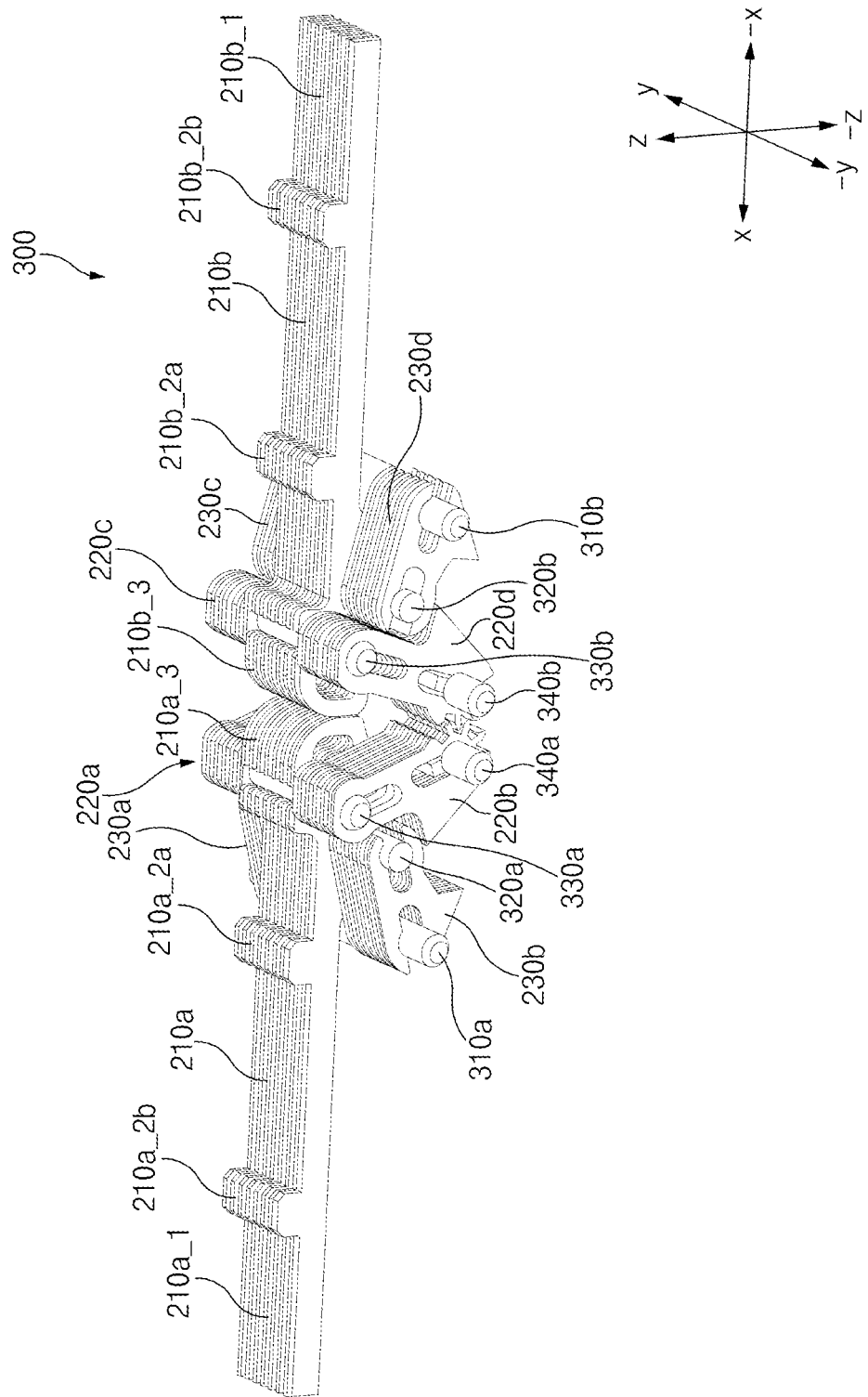
FIG. 5 is a view illustrating an example of a link structure of a link hinge structure according to an example embodiment.

FIG. 3 is a view illustrating an example of an external appearance of a link hinge structure of an electronic device according to various embodiments. FIG. 4 is a view illustrating an example of an exploded perspective view of a link hinge structure according to an embodiment. FIG. 5 is a view illustrating an example of a link structure of a link hinge structure according to an embodiment.

The link hinge structure 200 according to an embodiment may include a first rotary support member 211 (or a first rotary member), a second rotary support member 212 (or a second rotary member), a first fixing bracket 221, a second fixing bracket 222, a first rotary bar (a first rotational bar or a first rotational plate) 210a, a second rotary bar 210b, a first support bar (a first support plate) 230a, a second support bar 230b, a third support bar 230c, a fourth support bar 230d, a first interlocking gear bar (a first bar-type gear or a first bar-type interlocking gear) 220a, a second interlocking gear bar 220b, a third interlocking gear bar 220c, a fourth interlocking gear bar 220d, a first fixing shaft (a first shaft or a first fixed shaft) 310a, a second fixing shaft 310b, a third fixing shaft 340a, a fourth fixing shaft 340b, a first connection shaft (a first connecting shaft) 320a, a second connection shaft 320b, a third connection shaft 330a, and a fourth connection shaft 330b. According to an embodiment, to support a toggle fixing structure, a distance between the first fixing shaft 310a and the third fixing shaft 340a may be made to be larger than a distance between the first connection shaft 320a and the third connection shaft 330a, and a distance between the second fixing shaft 310b and the fourth fixing shaft 340b may be made to be larger than a distance between the second connection shaft 320b and the fourth connection shaft 330b.

A first rotary member (a first rotator, a first rotational member, a first rotational plate, or a first rotational bracket) 211 may be coupled to one side of the first housing 110, and may be rotated in correspondence to a hinge operation of the first housing 110. According to various embodiments, the first rotary member 211 may be formed as a portion of the first housing 110 (e.g., may be integrally formed with the first housing 110 or may include the first housing 110). According to an embodiment, the first rotary member 211 may include a first rotary body 211_1, at least one first housing coupling hole 211_3 used for connection to the first housing 110, and a first bar coupling hole 211_2a and a second bar coupling hole 211_2b, into which protrusions 210a_2a and 210a_2b formed in the first rotary bar 210a are inserted. The first rotary body 211_1, for example, may include a plate member having a specific thickness. The first rotary body 211_1 may have a substantially rectangular shape, and a shape of a portion that is adjacent to a periphery of the first rotary bar 210a in the −x axis direction and a shape of a portion that is adjacent to a periphery of the first rotary bar 210a in the x axis direction may be different. For example, a y axis length of a periphery of the first rotary body 211_1 in the x axis direction may be different from a y axis length of a periphery of the first rotary body 211_1 in the −x axis direction. According to an embodiment, an y axis length of a periphery of the first rotary body 211_1 in the x axis direction may be longer than a y axis length of a periphery of the first rotary body 211_1 in the −x axis direction. Accordingly, the first rotary body 211_1 may include at least a portion, a y axis length of which becomes gradually smaller as it goes from the x axis direction to the −x axis direction. The first housing coupling hole 211_3 may be formed to pass through a z axis surface and a −z axis surface of the first rotary body 211_1. A coupling member, such as a screw, may be inserted into the first housing coupling hole 211_3 to couple the first housing 110 and the first rotary member 211. In the illustrated drawing, it is exemplified that four first housing coupling holes 211_3 are disposed, but the disclosure is not limited thereto. For example, a plurality of or two or more first housing coupling holes 211_3 may be formed. The first bar coupling hole 211_2a may be formed on one side of the first rotary body 211_1 and may be formed to pass through a z axis surface and a −z axis surface of the first rotary body 211_1. The first protrusion 210a_2a formed in the first rotary bar 210a, for example, may be inserted into and fixed to the first bar coupling hole 211_2a through an interference-fitting scheme. In this regard, a shape of an opening of the first bar coupling hole 211_2a may have a shape corresponding to a shape of a periphery of the first protrusion 210a_2a. According to an embodiment, a size of the first bar coupling hole 211_2a may be a size that is not more than the size of the periphery of the first protrusion 210a_2a. For example, when a horizontal cross-section of the first protrusion 210a_2a has a four-sided (or polygonal) shape, the shape of the opening of the first bar coupling hole 211_2a may have a four-sided (or polygonal) shape. The first bar coupling hole 211_2a may be biased in the −x axis direction with respect to the second bar coupling hole 211_2b. The second bar coupling hole 211_2b may be disposed on the x axis direction in parallel to the first bar coupling hole 211_2a. At least a portion of the second protrusion 210a_2b may be inserted into and fixed to the second bar coupling hole 211_2b. In this regard, a shape of an opening of the second bar coupling hole 211_2b may have a shape corresponding to a shape of a periphery of the second protrusion 210a_2b. The second bar coupling hole 211_2b may be disposed to be spaced apart from the first bar coupling hole 211_2a by a specific interval.

The second rotary member 212 may be coupled to one side of the second housing 120, and may be rotated in correspondence to a hinge operation of the second housing 120. According to various embodiments, the second rotary member 212 may be formed as a portion of the second housing 120 (e.g., may be integrally formed with the second housing 120 or may include the second housing 120). According to an embodiment, the second rotary member 212 may include a second rotary body 212_1, at least one second housing coupling hole 212_3 used for connection to the second housing 120, and a third bar coupling hole 212_2a and a fourth bar coupling hole 212_2b, into which protrusions 210b2a and 210b2b formed in the second rotary bar 210b are inserted. The above-described second rotary member 212 may have a size and a shape that are the same as those of the above-described first rotary member 211.

The first fixing bracket (a first fixed bracket or a first fixed member) 221 may be used to fix sides of, among the shafts included in a link structure 300, the fixing shafts 310a, 310b, 340a, and 340b. The first fixing bracket 221 may include a first bracket body 221_1, a first hinge housing coupling hole 221_2a and a second hinge housing coupling hole 221_2b formed on one side of the first bracket body 221_1, and shaft coupling recesses 221_3a, 221_3b, 221_3c, and 221_3d disposed in the −y axis direction and coupled to the fixing shafts 310a, 310b, 340a, and 340b.

The first bracket body 221_1 may be formed to be concave in the z axis direction and may have a substantially U shape. At least a portion of the first bracket body 221_1, for example, may be formed of a metallic material. Furthermore, at least a portion of the first bracket body 221_1 may be formed of a nonmetallic material having a specific stiffness. The concave shape of the first bracket body 221_1 may function to prevent or reduce contact with the display 160 when the electronic device is in the folded state.

With reference to the drawing, the first hinge housing coupling hole 221_2a may be disposed on a left side of a center of the first bracket body 221_1 and a direction of the formed hole may be a vertical direction (e.g., a direction that passes from the −z axis to the z axis). The first hinge housing coupling hole 221_2a may pass through the z axis and the −z axis vertically. A boss formed on one side of the hinge housing 150 in a direction of the display 160 may be inserted into the first hinge housing coupling hole 221_2a. In a state, in which the boss disposed in the hinge housing 150 is inserted into the first hinge housing coupling hole 221_2a, a separate coupling member (e.g., a screw) may couple the first hinge housing coupling hole 221_2a and the boss.

With reference to the drawing, the second hinge housing coupling hole 221_2b may be disposed on a right side of a center of the first bracket body 221_1 and a direction of the formed hole may be the same vertical direction that is the same as that of the first hinge housing coupling hole 221_2a. The second hinge housing coupling hole 221_2b may be disposed at a location that is symmetrical to the first hinge housing coupling hole 221_2a with respect to the y axis of a center of the first bracket body 221_1. When the second hinge housing coupling hole 221_2b is formed to have a shape that is the same as or similar to that of the first hinge housing coupling hole 221_2a, it may be coupled to the hinge housing 150 by a coupling member after the separate boss provided in the hinge housing 150 is inserted thereinto.

The shaft coupling recesses 221_3a, 221_3b, 221_3c, and 221_3d may include the first shaft coupling recess 221_3a coupled to an y axis end of the first fixing shaft 310a, the second shaft coupling recess 221_3b coupled to an y axis end of the second fixing shaft 310b, the third shaft coupling recess 221_3c coupled to an y axis end of the third fixing shaft 340a, and the fourth shaft coupling recess 221_3d coupled to an y axis end of the fourth fixing shaft 340b. At least one of the shaft coupling recesses 221_3a, 221_3b, 221_3c, and 221_3d may be provided in a form of a boss that protrudes from a surface of the first bracket body 221_1, which faces the −y axis, in the −y axis direction, or may be engraved on a surface of the first bracket body 221_1 in the −y axis direction. The shaft coupling recesses 221_3a, 221_3b, 221_3c, and 221_3d may be spaced apart from each other by a specific interval. Spacing intervals and locations of the shaft coupling recesses 221_3a, 221_3b, 221_3c, and 221_3d may be determined according to the locations of the fixing shafts.

The first fixing bracket 221 may further include shaft coupling recesses 221_3e, 221_3f, 221_3g, and 221_3h that are disposed on a surface of the first bracket body 221_1, which faces the y axis direction. The shaft coupling recesses 221_3e, 221_3f, 221_3g, and 221_3h may be configurations that are unnecessary in the link hinge structure 200, and may be omitted. However, because the first fixing bracket 221 and the second fixing bracket 222 have the same shape, the shaft coupling recesses 221_3e, 221_3f, 221_3g, and 221_3h may be additionally formed as they are made by the same manufacturing apparatus and through the same manufacturing process for compatibility.

The second fixing bracket 222 may have a structure that is the same as or similar to that of the first fixing bracket 221. For example, the second fixing bracket 222 may be used to fix opposite sides of, among the shafts included in the link structure, the fixing shafts 310a, 310b, 340a, and 340b. The second fixing bracket 222 may include a second bracket body 222_1, a third hinge housing coupling hole 222_2a and a fourth hinge housing coupling hole 222_2b formed on one side of the second bracket body 222_1, and shaft coupling recesses 222_3a, 222_3b, 222_3c, and 222_3d disposed in the y axis direction and coupled to the fixing shafts 310a, 310b, 340a, and 340b.

The second bracket body 222_1 may be formed to be concave in the z axis direction and may have a substantially U shape. The second bracket body 222_1 may a shape and a size that are substantially the same or similar to those of the first bracket body 221_1.

The third hinge housing coupling hole 222_2a and the fourth hinge housing coupling hole 222_2b may be used to fix the first fixing bracket 221 to the hinge housing 150. The third hinge housing coupling hole 222_2a and the fourth hinge housing coupling hole 222_2b may have structures that are the same as or similar to those of the first hinge housing coupling hole 221_2a and the second hinge housing coupling hole 221_2b.

The shaft coupling recesses 222_3a, 222_3b, 222_3c, and 222_3d may include the fifth shaft coupling recess 222_3a coupled to an y axis end of the first fixing shaft 310a, the sixth shaft coupling recess 222_3b coupled to an −y axis end of the second fixing shaft 310b, the seventh shaft coupling recess 222_3c coupled to an y axis end of the third fixing shaft 340a, and the eighth shaft coupling recess 222_3d coupled to an −y axis end of the fourth fixing shaft 340b. At least one of the shaft coupling recesses 222_3a, 222_3b, 222_3c, and 222_3d may be provided in a form of a boss that protrudes from a surface of the second bracket body 222_1, which faces the y axis, in the y axis direction, or may be engraved on a surface of the second bracket body 222_1 in the y axis direction. The shaft coupling recesses 222_3a, 222_3b, 222_3c, and 222_3d may be spaced apart from each other by a specific interval. Spacing intervals and locations of the shaft coupling recesses 222_3a, 222_3b, 222_3c, and 222_3d may be determined according to the locations of the fixing shafts. The above-described shaft coupling recesses 222_3a, 222_3b, 222_3c, and 222_3d may be disposed to be symmetrical to the shaft coupling recesses 221_3a, 221_3b, 221_3c, and 221_3d formed in the first fixing bracket 221 described above with respect to the x axis. Additionally the second fixing bracket 222 may further include shaft coupling recesses 222_3e, 222_3f, 222_3g, and 222_3h that are disposed on a surface of the second bracket body 222_1, which faces the −y axis direction. The shaft coupling recesses 222_3e, 222_3f, 222_3g, and 222_3h may be configurations that are unnecessary in the link hinge structure 200, and may be omitted.

The first rotary bar 210a may have a bar shape, an x axis length of which is larger than a y axis length thereof. In the first rotary bar 210a, at least one convexo-concave that protrudes in the z axis direction in a state, in which a surface in the z axis direction is formed flat, or at least one convexo-concave that protrudes in the z axis direction in a state, in which a plurality of bodies having a specific thickness are disposed to overlap each other in the y axis direction. According to various embodiments, the plurality of bodies may be bonded to each other or bonding layers may be disposed between the plurality of bodies. When the plurality of bodies that are plate members are superimposed on each other to constitute a single body, a curling resistance may be generated, whereby flexibility may be improved while a strength of the first rotary bar 210a may be increased and an anti-wearing property may be improved. When other bars (e.g., support bars and interlocking gear bars) also are formed by superimposing a plurality of bodies, strength, flexibility, and/or an anti-wearing property may be improved. According to various embodiments, in relation to improvement of frictional forces, a plurality of bodies that are plate members (e.g., sk5, sus303 ¾h) having an elastic pin structure may be superimposed. The above-described structure employing the plurality of bodies may be easily manufactured, may have a high size precision, may reduce loss of frictional forces, and/or may improve a life span against fatigue destruction. According to various embodiments, the first rotary bar 210a may have one body. The above-described first rotary bar 210a may include a first rotary bar body 210a_1, the first protrusion 210a_2a, the second protrusion 210a_2b, and a first header 210a_3. The first rotary bar body 210a_1 may extend while having a specific length and a specific thickness in the x axis direction, and the first header 210a_3 may be disposed at a periphery thereof in the −x axis direction. The first protrusion 210a_2a and the second protrusion 210a_2b may be disposed on a surface of the first rotary bar body 210a_1 in the z axis direction, at a specific interval. An interval between the first protrusion 210a_2a and the second protrusion 210a_2b may be the same as a spacing distance between the first bar coupling hole 211_2a and the second bar coupling hole 211_2b, which are formed in the first rotary member 211. The first header 210a_3 may be disposed at a periphery of the first rotary bar body 210a_1 in the −x axis direction. The first header 210a_3 may be disposed to contact the header of a second rotary bar body 210b_1 when the electronic device 100 is in the unfolded state. At least a portion of a central portion of the first header 210a_3 may be empty, and may be formed of an elastic material (e.g., a metallic material, sk5 (a kind of carbon tool steels), or sus301 ¾h (a kind of stainless use steels)). Accordingly, the first header 210a_3 may be a state, in which it is pressed by an elastic force while contacting a second header 210b_3.

The second rotary bar 210b may have a size and a shape that are the same as or similar to those of the first rotary bar 210a. For example, the second rotary bar 210b may include the second rotary bar body 210b_1, the third protrusion 210b_2a, the fourth protrusion 210b_2b, and the second header 210b_3. The second rotary bar body 210b_1 may have a shape and a size that are the same as or similar to those of the first rotary bar body 210a_1, and may be disposed to be symmetrical to the first rotary bar body 210a_1 with respect to the z axis. The third protrusion 210b_2a and the fourth protrusion 210b_2b may be disposed on a surface of the second rotary bar body 210b_1 in the z axis direction while having a specific height. At least a portion of the third protrusion 210b_2a may be inserted into the third bar coupling hole 212_2a of the second rotary member 212, and at least a portion of the fourth protrusion 210b_2b may be inserted into the fourth bar coupling hole 212_2b of the second rotary member 212. The second header 210b_3 may be disposed at a periphery of the second rotary bar body 210b_1 in the x axis direction. At least a portion of the second header 210b_3 may be in a state, in which it contacts the first header 210a_3, when the electronic device 100 is in the unfolded state. At least a portion of a central portion of the second header 210b_3 is empty and is formed of an elastic material (e.g., a metallic material), and thus a pressure by an elastic force may be exerted toward the first header 210a_3 while contacting the first header 210a_3. Accordingly, the second header 210b_3 may exert an elastic force in the x axis direction while contacting the first header 210a_3, and the electronic device 100 may maintain a free-stop state (e.g., maintain a current state when a separate additional pressure is not applied), based on contact with the first header 210a_3 that exerts an elastic force in the −x axis direction.

One side of the first support bar 230a may be fixed to the first fixing shaft 310a coupled to the first fixing bracket 221 and the second fixing bracket 222, and the first support bar 230a may be coupled to one side of the first rotary bar 210a through the first connection shaft 320a. The first support bar 230a may have a substantially L shape. The first support bar 230a, for example, may be disposed in an area of one surface of the first rotary bar 210a in the y axis direction, in which the first header 210a_3 is disposed. A plurality of bodies may be disposed in the first support bar 230a to be superimposed in the y axis direction or one body may be formed therein.

The second support bar 230b may have a structure that are the same as or similar to that of the first support bar 230a. One side of the second support bar 230b may be fixed to the first fixing shaft 310a coupled to the first fixing bracket 221 and the second fixing bracket 222, and the second support bar 230b may be coupled to an opposite side of the first rotary bar 210a through the first connection shaft 320a. The second support bar 230b may have a substantially L shape like the first support bar 230a. The second support bar 230b, for example, may be disposed in an area of one surface of the first rotary bar 210a in the −y axis direction, in which the first header 210a_3 is disposed. The second support bar 230b may be disposed to be symmetrical to the first support bar 230a with respect to an imaginary axis that crosses the x and −x axes or the first rotary bar 210a.

The third support bar 230c may have a structure that are the same as or similar to that of the first support bar 230a. One side of the third support bar 230c may be fixed to the second fixing shaft 310b coupled to the first fixing bracket 221 and the second fixing bracket 222, and the third support bar 230c may be coupled to one side of the second rotary bar 210b through the second connection shaft 320b. The third support bar 230c may have a substantially L shape like the first support bar 230a. The third support bar 230c, for example, may be disposed in an area of one surface of the second rotary bar 210b in the y axis direction, in which the second header 210b_3 is disposed. The third support bar 230c may be disposed to be symmetrical to the first support bar 230a with respect to an imaginary axis that crosses the y and −y axes.

The fourth support bar 230d may have a structure that are the same as or similar to that of the first support bar 230a. One side of the fourth support bar 230d may be fixed to the second fixing shaft 310b coupled to the first fixing bracket 221 and the second fixing bracket 222, and the fourth support bar 230d may be coupled to an opposite side of the second rotary bar 210b through the second connection shaft 320b. The fourth support bar 230d may have a substantially L shape like the first support bar 230a. The fourth support bar 230d, for example, may be disposed in an area of one surface of the second rotary bar 210b in the −y axis direction, in which the second header 210b_3 is disposed. The fourth support bar 230d may be disposed to be symmetrical to the second support bar 230b with respect to an imaginary axis that crosses the y and −y axes, and may be disposed to be symmetrical to the third support bar 230c with respect to an imaginary axis that crosses the x and −x axes.

One side of the first interlocking gear bar 220a may be fixed to the third fixing shaft 340a coupled to the first fixing bracket 221 and the second fixing bracket 222, and the first interlocking gear bar 220a may be coupled to one side of the first rotary bar 210a through the third connection shaft 330a. The first interlocking gear bar 220a may be in a state, in which it contacts at least a portion of the first support bar 230a according to the folded state of the electronic device 100. A gear pattern engaged with a gear pattern formed in the third interlocking gear bar 220c may be formed on one side of the first interlocking gear bar 220a. The first interlocking gear bar 220a, for example, may be disposed in an area of one surface of the first rotary bar 210a in the y axis direction, in which the first header 210a_3 is disposed, and an area thereof, in which the first support bar 230a is disposed. A plurality of bodies may be disposed in the first interlocking gear bar 220a to be superimposed in the y axis direction or one body may be formed therein.

One side of the second interlocking gear bar 220b may be fixed to the third fixing shaft 340a coupled to the first fixing bracket 221 and the second fixing bracket 222, and the second interlocking gear bar 220b may be coupled to an opposite side of the first rotary bar 210a through the third connection shaft 330a. The second interlocking gear bar 220b may be in a state, in which it contacts at least a portion of the second support bar 230b according to the folded state of the electronic device 100. A gear pattern engaged with a gear pattern formed in the fourth interlocking gear bar 220d may be formed on one side of the second interlocking gear bar 220b. The second interlocking gear bar 220b, for example, may be disposed in an area of one surface of the first rotary bar 210a in the −y axis direction, in which the first header 210*a*_3 is disposed, and an area thereof, in which the second support bar 230*b* is disposed. A plurality of bodies may be disposed in the second interlocking gear bar 220*b* to be superimposed in the y axis direction or one body may be formed therein. The second interlocking gear bar 220*b* may be disposed to be symmetrical to the first interlocking gear bar 220*a* with respect to an imaginary axis that crosses the x and −x axes.

One side of the third interlocking gear bar 220*c* may be fixed to the fourth fixing shaft 340*b* coupled to the first fixing bracket 221 and the second fixing bracket 222, and the third interlocking gear bar 220*c* may be coupled to one side of the second rotary bar 210*b* through the fourth connection shaft 330*b*. The third interlocking gear bar 220*c* may be in a state, in which it contacts at least a portion of the third support bar 230*c* according to the folded state of the electronic device 100. A gear pattern engaged with a gear pattern formed in the first interlocking gear bar 220*a* may be formed on one side of the third interlocking gear bar 220*c*. The third interlocking gear bar 220*c*, for example, may be disposed in an area of one surface of the second rotary bar 210*b* in the y axis direction, in which the second header 210*b*_3 is disposed, and an area thereof, in which the third support bar 230*c* is disposed. A plurality of bodies may be disposed in the third interlocking gear bar 220*c* to be superimposed in the y axis direction or one body may be formed therein. The third interlocking gear bar 220*c* may be disposed to be symmetrical to the fourth interlocking gear bar 220*d* with respect to an imaginary axis that crosses the x and −x axes, and may be disposed to be symmetrical to the first interlocking gear bar 220*a* with respect to an imaginary axis that crosses the y and −y axes.

One side of the fourth interlocking gear bar 220*d* may be fixed to the fourth fixing shaft 340*b* coupled to the first fixing bracket 221 and the second fixing bracket 222, and the fourth interlocking gear bar 220*d* may be coupled to an opposite side of the second rotary bar 210*b* through the fourth connection shaft 330*b*. The fourth interlocking gear bar 220*d* may be in a state, in which it contacts at least a portion of the fourth support bar 230*d* according to the folded state of the electronic device 100. A gear pattern engaged with a gear pattern formed in the second interlocking gear bar 220*b* may be formed on one side of the fourth interlocking gear bar 220*d*. The fourth interlocking gear bar 220*d*, for example, may be disposed in an area of one surface of the second rotary bar 210*b* in the −y axis direction, in which the second header 210*b*_3 is disposed, and an area thereof, in which the fourth support bar 230*d* is disposed. A plurality of bodies may be disposed in the fourth interlocking gear bar 220*d* to be superimposed in the −y axis direction or one body may be formed therein. The fourth interlocking gear bar 220*d* may be disposed to be symmetrical to the third interlocking gear bar 220*c* with respect to an imaginary axis that crosses the x and −x axes, and may be disposed to be symmetrical to the second interlocking gear bar 220*b* with respect to an imaginary axis that crosses the y and −y axes.

The first fixing shaft 310*a* may be disposed to pass through one side of the first support bar 230*a* and one side of the second support bar 230*b* in the y axis or −y axis direction. The first fixing shaft 310*a* may be coupled and fixed to the first shaft coupling recess 221_3*a* of the first fixing bracket 221 and the fifth shaft coupling recess 222_3*a* of the second fixing bracket 222. Accordingly, the first fixing shaft 310*a* may have a length that is larger than a total sum of a y axis thickness of the first support bar 230*a*, a y axis thickness of the first rotary bar 210*a*, and a y axis thickness of the second support bar 230*b*. According to various embodiments, the first fixing shaft 310*a* may have a length that is larger than that of the first connection shaft 320*a* in the y axis and −y axis directions.

The second fixing shaft 310*b* may be disposed to pass through one side of the third support bar 230*c* and one side of the fourth support bar 230*d* in the y axis or −y axis direction. The second fixing shaft 310*b* may be coupled and fixed to the second shaft coupling recess 221_3*b* of the first fixing bracket 221 and the sixth shaft coupling recess 222_3*b* of the second fixing bracket 222. Accordingly, the second fixing shaft 310*b* may have a length that is larger than a total sum of a y axis thickness of the third support bar 230*c*, a y axis thickness of the second rotary bar 210*b*, and a y axis thickness of the fourth support bar 230*d*. According to various embodiments, the second fixing shaft 310*b* may have a length that is larger than that of the second connection shaft 320*b* in the y axis and −y axis directions. The second fixing shaft 310*b* may be disposed to be symmetrical with respect to an imaginary axis that crosses the y axis and the −y axis.

The third fixing shaft 340*a* may be disposed to pass through one side of the first interlocking gear bar 220*a* and one side of the second interlocking gear bar 220*b* in the y axis or −y axis direction. The third fixing shaft 340*a* may be coupled and fixed to the third shaft coupling recess 221_3*c* of the first fixing bracket 221 and the seventh shaft coupling recess 222_3*c* of the second fixing bracket 222. Accordingly, the third fixing shaft 340*a* may have a length that is larger than a total sum of a y axis thickness of the first interlocking gear bar 220*a*, a y axis thickness of the second rotary bar 210*b*, and a y axis thickness of the second interlocking gear bar 220*b*. According to various embodiments, the third fixing shaft 340*a* may have a length that is larger than that of the third connection shaft 330*a* in the y axis and −y axis directions. The third fixing shaft 340*a* may be disposed to be symmetrical to the fourth fixing shaft 340*b* with respect to an imaginary axis that crosses the y axis and the −y axis. According to various embodiments, the third fixing shaft 340*a* may include a first rail boss 340*a*_1 that protrudes in the z axis direction for rotation of the first interlocking gear bar 220*a* or the second interlocking gear bar 220*b*. Furthermore, a part of the third fixing shaft 340*a* may have a cylindrical shape, and the first rail boss 340*a*_1 may be disposed to protrude from an outer peripheral surface of the column. The first rail boss 340*a*_1 may be inserted into the recesses formed in the first interlocking gear bar 220*a* and the second interlocking gear bar 220*b* to be rotated within a specific angle range in one direction according to rotation of the first rotary bar 210*a*.

The fourth fixing shaft 340*b* may be disposed to pass through one side of the third interlocking gear bar 220*c* and one side of the fourth interlocking gear bar 220*d* in the y axis or −y axis direction. The fourth fixing shaft 340*b* may be coupled and fixed to the fourth shaft coupling recess 221_3*d* of the first fixing bracket 221 and the eighth shaft coupling recess 222_3*d* of the fourth fixing bracket 340*b*. Accordingly, the fourth fixing shaft 340*b* may have a length that is larger than a total sum of a y axis thickness of the third interlocking gear bar 220*c*, a y axis thickness of the second rotary bar 210*b*, and a y axis thickness of the fourth interlocking gear bar 220*d*. According to various embodiments, the fourth fixing shaft 340*b* may have a length that is larger than that of the fourth connection shaft 330*b* in the y axis and −y axis directions. The fourth fixing shaft 340*b* may be disposed to be symmetrical to the third fixing shaft 340*a* with respect to an imaginary axis that crosses the y axis and the −y axis. According to various embodiments, the fourth shaft 340*b* may include a second rail boss 340*b*_1 that protrudes in the z axis direction for rotation of the third interlocking gear bar 220*c* or the fourth interlocking gear bar 220*d*. According to various embodiments, a part of the fourth fixing shaft 340*b* may have a cylindrical shape, and the second rail boss 340*b*_1 may be disposed to protrude from an outer wall of the cylindrical shape while having a specific length in the y axis direction. The second rail boss 340*b*_1 may be inserted into the recesses formed in the third interlocking gear bar 220*c* and the fourth interlocking gear bar 220*d* to be rotated within a specific angle range in one direction according to rotation of the second rotary bar 210*b*. Except for the first rail boss 340*a*_1 formed in the third fixing shaft 340*a* and the second rail boss 340*b*_1 formed in the fourth fixing shaft 340*b*, the above-described first to fourth fixing shafts 310*a*, 310*b*, 340*a*, and 340*b* may have a cylindrical shape, of which a central part in the y axis or −y axis are thicker than a peripheral part thereof as a whole.

The first connection shaft 320*a* may be disposed to pass through an opposite side of the first support bar 230*a* and an opposite side of the second support bar 230*b* in the y axis or −y axis direction. The first connection shaft 320*a* may not be fixed to the first fixing bracket 221 and the second fixing bracket 222, and may be moved in an arc shape within a specific angle range with respect to the first fixing shaft 310*a*. The first connection shaft 320*a* may have a length that is equal to or larger than a total sum of a y axis thickness of the first support bar 230*a*, a y axis thickness of the first rotary bar 210*a*, and a y axis thickness of the second support bar 230*b*. According to various embodiments, the first connection shaft 320*a* may have a length that is smaller than that of the first fixing shaft 310*a* in the y axis and −y axis directions.

The second connection shaft 320*b* may be disposed to pass through an opposite side of the third support bar 230*c* and an opposite side of the fourth support bar 230*d* in the y axis or −y axis direction. The second connection shaft 320*b* may not be fixed to the first fixing bracket 221 and the second fixing bracket 222, and may be moved in an arc shape within a specific angle range with respect to the second fixing shaft 310*b*. The second connection shaft 320*b* may have a length that is equal to or larger than a total sum of a y axis thickness of the third support bar 230*c*, a y axis thickness of the second rotary bar 210*b*, and a y axis thickness of the fourth support bar 230*d*. According to various embodiments, the second connection shaft 320*b* may have a length that is smaller than that of the second fixing shaft 310*b* in the y axis and −y axis directions. The second connection shaft 320*b* may be disposed to be symmetrical to the first connection shaft 320*a* with respect to an imaginary axis that crosses the y axis and the −y axis.

The third connection shaft 330*a* may be disposed to pass through an opposite side of the first interlocking gear bar 220*a*, one side of the first header 210*a*_3, and one side of the second interlocking gear bar 220*b* in the y axis or −y axis direction. The third connection shaft 330*a* may not be fixed to the first fixing bracket 221 and the second fixing bracket 222, and may be moved in an arc shape within a specific angle range with respect to the third fixing shaft 340*a*. The third connection shaft 330*a* may have a length that equal to or larger than a total sum of a y axis thickness of the first interlocking gear bar 220*a*, a y axis thickness of the first header 210*a*_3, and a y axis thickness of the second interlocking gear bar 220*b*. According to various embodiments, the third connection shaft 330*a* may have a length that is smaller than that of the third fixing shaft 340*a* in the y axis and −y axis directions. The third connection shaft 330*a* may be disposed to be symmetrical to the fourth connection shaft 330*b* with respect to an imaginary axis that crosses the y axis and the −y axis.

The fourth connection shaft 330*b* may be disposed to pass through an opposite side of the third interlocking gear bar 220*c*, one side of the second header 210*b*_3, and an opposite side of the fourth interlocking gear bar 220*d* in the y axis or −y axis direction. The fourth connection shaft 330*b* may not be fixed to the first fixing bracket 221 and the second fixing bracket 222, and may be moved in an arc shape within a specific angle range with respect to the fourth fixing shaft 340*b*. The fourth connection shaft 330*b* may have a length that is equal to or larger than a total sum of a y axis thickness of the third interlocking gear bar 220*c*, a y axis thickness of the second header 210*b*_3, and a y axis thickness of the fourth interlocking gear bar 220*d*. According to various embodiments, the fourth connection shaft 330*b* may have a length that is shorter than that of the fourth fixing shaft 340*b* in the y axis and −y axis directions. The fourth connection shaft 330*b* may be disposed to be symmetrical to the third connection shaft 330*a* with respect to an imaginary axis that crosses the y axis and the −y axis. The first to fourth connection shafts 330*b* may have a cylindrical shape, a diameter of which is constant along the y axis or −y axis as a whole.

Figure 6:
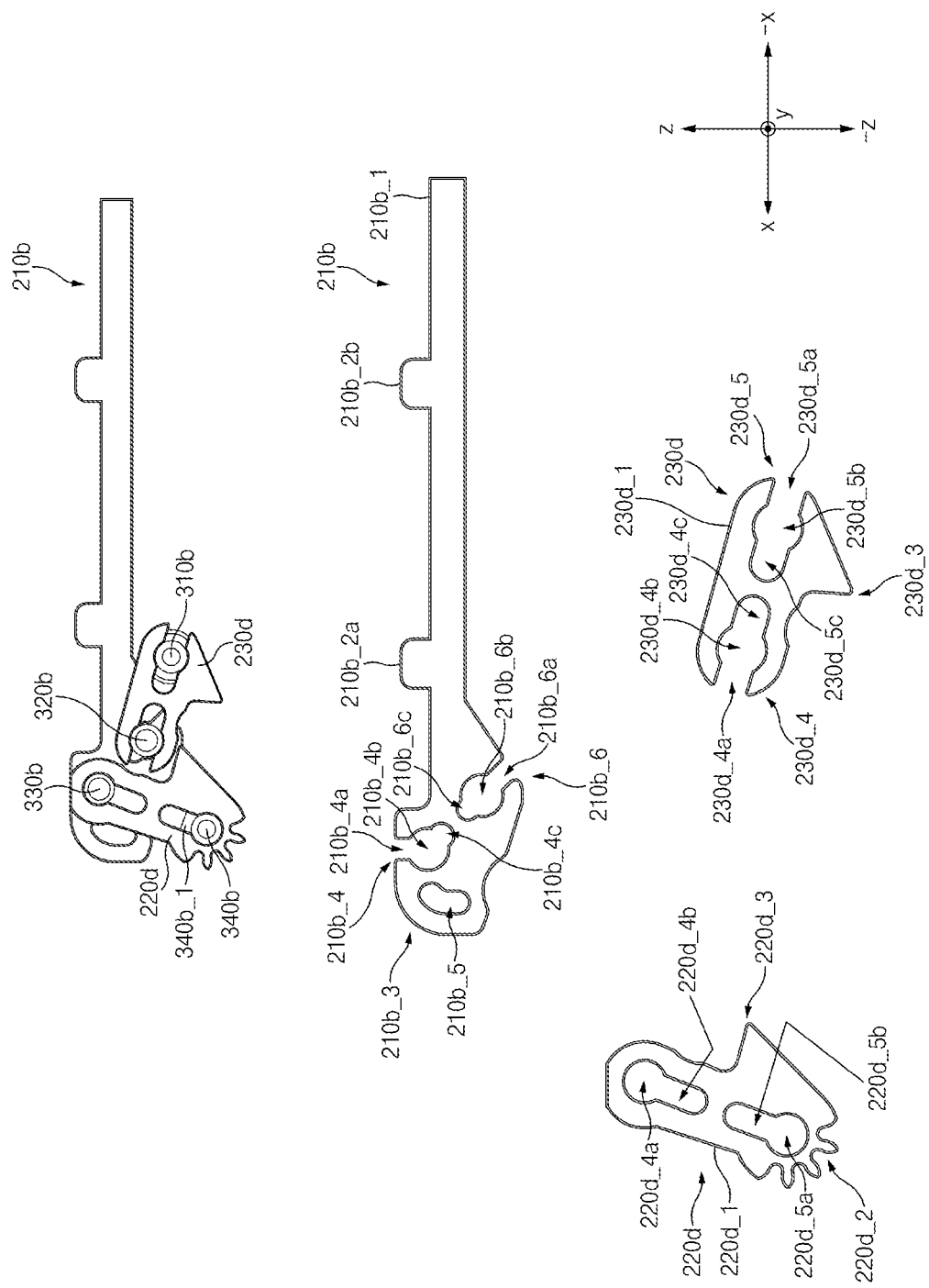
FIG. 6 is a view illustrating one surface of a portion of a hinge structure applied to an electronic device according to various example embodiments.

FIG. 6 is a view illustrating one surface of a portion of a hinge structure applied to an electronic device according to various embodiments.

Referring to FIGS. 3 to 6, as mentioned above, the first rotary bar 210*a* may have the same shape and size that are the same as those of the second rotary bar 210*b*, the first to fourth support bars 230*a*, 230*b*, 230*c*, and 230*d* may have the same shape and size, and the first to fourth interlocking gear bars 220*a*, 220*b*, 220*c*, and 220*d* may have the same shape and size. Accordingly, as illustrated, an example of detailed structures of the configurations will be described with reference to the second rotary bar 210*b*, the fourth support bar 230*d*, and the fourth interlocking gear bar 220*d*.

According to an embodiment, the second rotary bar 210*b* may include the second rotary bar body 210*b*_1, the third protrusion 210*b*2*a*, the fourth protrusion 210*b*2*b*, the second header 210*b*_3, a first connection shaft insertion recess 210*b*_4, a second connection shaft insertion recess 210*b*_6, and an elastic hole 210*b*_5. The second rotary bar body 210*b*_1, as described above, may be formed such that a length thereof in the x axis or −x axis direction is larger than a length thereof in the y axis direction, and may be disposed to be spaced apart from the third protrusion 210*b*2*a* and the fourth protrusion 210*b*2*b* by a specific interval in the z axis direction.

The second header 210*b*_3 may have a size that is larger than a z axis thickness of the second rotary bar body 210*b*_1, and may extend having a specific shape in the z axis direction. The first connection shaft insertion recess 210*b*_4 may be formed on one side of the second header 210*b*_3, and may have a shape that is opened in the z axis direction. The first connection shaft insertion recess 210*b*_4 may include a first opening 210*b*_4*a*, into which the fourth connection shaft 330*b* is inserted, a second opening 210*b*_4*b* (e.g., a space and/or an aperture) that extends from the first opening 210*b*_4*a* and is formed in the −z axis direction, and in which the fourth connection shaft 330*b* is seated, and a third opening 210*b*_4*c* that extends from the second opening 210*b*_4*b* and extends in the −z axis direction or in a direction of a specific angle between the −x axis and the −z axis. The first opening 210*b*_4*a* may have a size that is smaller than a diameter of the fourth connection shaft 330*b* such that the fourth connection shaft 330b is prevented from being easily separated from an inside of the first connection shaft insertion recess 210b_4 after being inserted thereinto. The second opening 210b_4b may have a size that is not less than the diameter of the fourth connection shaft 330b. The third opening 210b_4c may increase a flexibility (e.g., an elasticity) of the second header 210b_3 such that one side of the second header 210b_3 is prevented or reduced from being damaged due to motion of the fourth connection shaft 330b. The third opening 210b_4c may have a size that is smaller than the diameter of the fourth connection shaft 330b. According to various embodiments, a part of at least one of the first opening 210b4a and the third opening 210b_4c, which overlaps adjacent bars (e.g., the interlocking gear bars) whereby an overload may be prevented or reduced from being generated in a plate member or a shaft due to a strong engagement of a specific magnitude or more.

The second connection shaft insertion recess 210b_6 may be formed on an opposite side of the second header 210b_3, and may have a shape that is opened in a direction of a specific angle between the −z and −x axis directions. The second connection shaft insertion recess 210b_6 may include a fourth opening 210b_6a, into which the second connection shaft 320b is inserted, a fifth opening 210b_6b (e.g., a space and/or an aperture) that extends from the fourth opening 210b_6a and is formed in the −z axis direction, and in which the second connection shaft 320b is seated, and a sixth opening 210b_6c that extends from the fifth opening 210b_6b and extends in the z axis direction or in a direction of a specific angle between the x axis and the z axis. The fourth opening 210b_6a may have a size that is smaller than a diameter of the second connection shaft 320b such that the second connection shaft 320b is prevented from being easily separated from an inside of the second connection shaft insertion recess 210b_6 after being inserted thereinto. The fifth opening 210b_6b may have a size that is not less than the diameter of the second connection shaft 320b in consideration of seating and rotation of the second connection shaft 320b. The sixth opening 210b_6c may increase a flexibility (e.g., an elasticity) of the second header 210b_3 such that one side of the second header 210b_3 is prevented from being significantly damaged due to motion of the second connection shaft 320b. The sixth opening 210b_6c may have a size that is smaller than the diameter of the second connection shaft 320b such that the second connection shaft 320b is prevented from being significantly moved. According to various embodiments, a part of at least one of the fourth opening 210b6a and the sixth opening 210b_6c, which overlaps adjacent bars (e.g., the support bars) whereby an overload may be prevented from being generated in a plate member or a shaft due to a strong engagement of a specific magnitude or more.

The elastic hole 210b_5 may be formed in a specific space on an inside of the second header 210b_3. According to an embodiment, the elastic hole 210b_5 may be formed at a periphery (a location that is adjacent to the first header 210a_3 when the electronic device 100 is in the unfolded state) in the x axis direction of the second header 210b_3. The elastic hole 210b_5, for example, may be formed to pass through the y axis and the −y axis of the second header 210b_3. The elastic hole 210b_5 may be formed such that a peripheral part of the second header 210b_3 in the x axis has a specific elasticity. A shape of the elastic hole 210b_5 is not limited to the illustrated shape, and a structure including a plurality of holes may be provided. The above-described structures of the first connection shaft insertion recess 210b_4 and the second connection shaft insertion recess 210b_6, and the elastic hole 210b_5 also may be formed in the first header 210a_3 in the same way.

The fourth interlocking gear bar 220d may include an interlocking gear body 220d_1, a gear pattern 220d_2, a first stopper 220d_3, a connection shaft insertion hole 220d_4a, a first hole extension part 220d_4b, a fixing shaft insertion hole 220d_5a, and a second hole extension part 220d_5b.

The interlocking gear body 220d_1 may be a plate member, of which a length in the z axis direction is larger than a length thereof in the x axis direction. The connection shaft insertion hole 220d_4a and the first hole extension part 220d_4b may be disposed on an upper side of the interlocking gear body 220d_1, and the fixing shaft insertion hole 220d_5a, the second hole extension part 220d_5b, the gear pattern 220d_2, and the first stopper 220d_3 may be disposed on a lower side thereof.

The gear pattern 220d_2 may be disposed on one side of a lower part of the interlocking gear body 220d_1. The number and size of gears of the gear pattern 220d_2 may be changed according to the overall size of the link hinge structure 300. The gear pattern 220d_2 may be formed in the interlocking gear body 220d_1 that is adjacent to the fixing shaft insertion hole 220d_5a.

The first stopper 220d_3 may protrude from the interlocking gear body 220d_1 in the −x axis direction. According to an embodiment, one area of the first stopper 220d_3 in the z axis direction may be formed flat, and may be formed to have a specific inclination angle from a periphery of the first stopper 220d_3 in the −x axis direction to a periphery thereof in the −z axis direction. A part of a support body 230d_1 (at least a part of a peripheral area of the fourth support bar 230d, in which a third connection shaft insertion recess 230d_4 is formed) is held in the flat area of the first stopper 220d_3 whereby the electronic device 100 may be prevented from being significantly bent by a specific angle or more (e.g., 180 degrees or more). Furthermore, the first stopper 220d_3 may prevent or reduce the chances of the display 160 from being bent such that the unfolded angle of the display 160 in the z axis direction is a specific angle or more (e.g., 180 degrees or more).

The connection shaft insertion hole 220d_4a may be formed at a periphery of the interlocking gear body 220d_1 in the z axis direction, and may be formed to pass through the y axis and the −y axis. The fourth connection shaft 330b may be inserted into the connection shaft insertion hole 220d_4a. In this regard, the connection shaft insertion hole 220d_4a may have a size that is the same as or similar to a diameter of the fourth connection shaft 330b.

The first hole extension part 220d_4b may be connected to the connection shaft insertion hole 220d_4a. The first hole extension part 220d_4b, for example, may include an empty space that extends from one side of the connection shaft insertion hole 220d_4a in the −z axis direction. The first hole extension part 220d_4b may be formed to pass through the y axis and the −y axis, and may have a size that is smaller than a size of the connection shaft insertion hole 220d_4a. A flexibility (e.g., an elasticity) around the connection shaft insertion hole 220d_4a may be improved by the first hole extension part 220d_4b whereby damage to a peripheral part of the connection shaft insertion hole 220d_4a due to insertion and motion of the fourth connection shaft 330b may be reduced.

The fixing shaft insertion hole 220d_5a may be disposed on one side of a lower portion (e.g., a periphery in the −z axis direction) of the interlocking gear body 220d_1. According to an embodiment, the fixing shaft insertion hole 220d_5a may be formed on the interlocking gear body 220d_1 that is adjacent to the gear pattern 220d_2. The fourth fixing shaft 340b may be inserted into the fixing shaft insertion hole 220d_5a. In this regard, the fixing shaft insertion hole 220d_5a may have a size that is the same as or similar to a diameter of the fourth fixing shaft 340b.

The second hole extension part 220d_5b may include an empty space that is connected a portion of the fixing shaft insertion hole 220d_5a and is formed only by a specific length, for example, in the z axis direction. A width of the second hole extension part 220d_5b may be formed to have a size that is smaller than a size of the fixing shaft insertion hole 220d_5a. At least a portion of the second rail boss 340b_1 formed in the fourth fixing shaft 340b may be disposed in the second hole extension part 220d_5b. Accordingly, while the fourth fixing shaft 340b is rotated, the fourth interlocking gear bar 220d may be moved in an arc shape within a specific angle range with respect to the fourth fixing shaft 340b. According to various embodiments, the second hole extension part 220d_5b may be formed to be longer than a size of a y axis cross-section of the second rail boss 340b_1. The flexibility (or elasticity) of the interlocking gear body 220d_1 may be increased by the second hole extension part 220d_5b, whereby an impact due to rotation of the fourth fixing shaft 340b may be alleviated. According to various embodiments, a part of at least one of the first hole extension part 220d_4b and the second hole extension part 220d_5b, which overlaps another adjacent bar (e.g., a rotary bar) is reduced whereby an overload may be prevented from being generated in a plate member or a shaft due to a strong engagement of a specific magnitude or more.

The above-described structure including the interlocking gear body 220d_1, the gear pattern 220d_2, the first stopper 220d_3, the connection shaft insertion hole 220d_4a, the first hole extension part 220d_4b, the fixing shaft insertion hole 220d_5a, and the second hole extension part 220d_5b also may be formed in the first interlocking gear bar 220a, the second interlocking gear bar 220b, and the third interlocking gear bar 220c in the same way. Although the structure of the connection shaft insertion hole 220d_4a has been described in the above description, but the disclosure is not limited thereto. For example, the connection shaft insertion hole 220d_4a may have a recess shape that is opened in the z axis direction.

The fourth support bar 230d may include the support body 230d_1, a second stopper 230d_3, the third connection shaft insertion recess 230d_4, and a fixing shaft insertion recess 230d_5.

A length of the support body 230d_1 in a first axis direction (e.g., an imaginary axis direction that crosses a specific angle between the z axis and the x axis), for example, may be larger than a length thereof in a second axis direction (e.g., an imaginary axis direction that crosses a specific angle between the z axis and the −x axis) that is perpendicular to the first axis direction. In the support body 230d_1, a plurality of bodies may be formed to overlap each other in the y axis direction or one body having a specific thickness in the y axis direction may be formed.

The second stopper 230d_3 may protrude at a specific location of the support body 230d_1 in one direction (e.g., the second axis direction). At least a portion of the second stopper 230d_3 may be formed flat. The flat area of the second stopper 230d_3 may support a portion (e.g., a peripheral portion of the connection shaft insertion hole 220d_4a, into which an upper side of the interlocking gear body 220d_1 or the fourth connection shaft 330b of the interlocking gear body 220d_1 is inserted) of the fourth interlocking gear bar 220d such that the electronic device 100 is prevented from being additionally rotated in the completely folded state (e.g., a state, in which one side of an upper end of the first housing 110 and one side of an upper end of the second housing 120 contact each other through folding).

The third connection shaft insertion recess 230d_4 may include a seventh opening 230d_4a that is opened in the first axis direction, an eighth opening 230d_4b that is connected to the seventh opening 230d_4a and is formed one side of the support body 230d_1, and a ninth opening 230d_4c that extends from the eighth opening 230d_4b in the second axis direction. The seventh opening 230d_4a, for example, may have a diameter that is smaller than a diameter of the fourth connection shaft 330b whereby the fourth connection shaft 330b may be prevented from being easily separated from the third connection shaft insertion recess 230d_4. The eighth opening 230b_4b may have a diameter that is not less than the diameter of the fourth connection shaft 330b. The ninth opening 230d_4c may extend from the eighth opening 230d_4b, and may have a size that is smaller than a size of the eighth opening 230d_4b. The ninth opening 230d_4c may prevent or reduce damage to the support body 230d_1 due to motion thereof by increasing the elasticity of the support body 230d_1 and then solving a pressure applied to the support body 230d_1 that is moved at a specific angle based on the fourth connection shaft 330b. According to various embodiments, a part of at least one of the seventh opening 230d_4a and the ninth opening 230d_4c, which overlaps another adjacent bar (e.g., the rotary bar) is reduced whereby an overload may be prevented from being generated in a plate member or a shaft due to a strong engagement of a specific magnitude or more.

The fixing shaft insertion recess 230d_5 may include a tenth opening 230d_5a that is opened in the second axis direction, an eleventh opening 230d_5b that is connected to the tenth opening 230d_5a and is formed one side of the support body 230d_1, and a twelfth opening 230d_5c that extends from the eleventh opening 230d_5b in the first axis direction. The tenth opening 230d_5a, for example, may have a diameter that is smaller than a diameter of the second fixing shaft 310b whereby the second fixing shaft 310b may be prevented from being easily separated from the fixing shaft insertion recess 230d_5. The eleventh opening 230d_5b may have a diameter that is the same as the diameter of the second fixing shaft 310b. The twelfth opening 230d_5c may extend from the eleventh opening 230d_5b, and may have a size that is smaller than a size of the eleventh opening 230d_5b. The twelfth opening 230d_5c may reduce a pressure applied to the support body 230d_1 while the support body 230d_1 is moved in an arc shape about the second fixing shaft 310b by increasing the elasticity of the support body 230d_1. According to various embodiments, a part of at least one of the tenth opening 230d_5a and the twelfth opening 230d_5c, which overlaps another adjacent bar (e.g., the rotary bar) is reduced whereby an overload may be prevented from being generated in a plate member or a shaft due to a strong engagement of a specific magnitude or more.

The above-described structure of the fourth support bar 230d including the support body 230d_1, the second stopper 230d_3, the third connection shaft insertion recess 230d_4, and the fixing shaft insertion recess 230d_5 also may be formed in the first support bar 230a, the second support bar 230b, and the third support bar 230c in the same way. According to various embodiments, the third connection shaft insertion recess 230d_4 may be in a form of a hole, and the fixing shaft insertion recess 230d_5 may be in a form of a hole.

According to various embodiments, diameters (or sizes) of the openings (e.g., 210b_4b, 210b_6b, 220d_4a, 220d_5a, 230d_4b, and 230d_5b), in which the above-described shafts (e.g., the first to fourth fixing shafts 310a, 310b, 340a, and 340b, and the first to fourth connection shafts 320a, 320b, 330a, and 330b) may be equal to or smaller than diameters of the shafts (e.g., 310a, 310b, 340a, 340b, 320a, 320b, 330a, and 330b) such that they may be inserted through an interference-fitting scheme. Accordingly, while the shafts (e.g., 310a, 310b, 340a, 340b, 320a, 320b, 330a, and 330b) are rotated, they generate frictions with the openings (e.g., 210b_4b, 210b_6b, 220d_4a, 220d_5a, 230d_4b, and 230d_5b), and the frictional forces may be used to temporarily fix the electronic device 100 at a specific angle.

Figure 7:
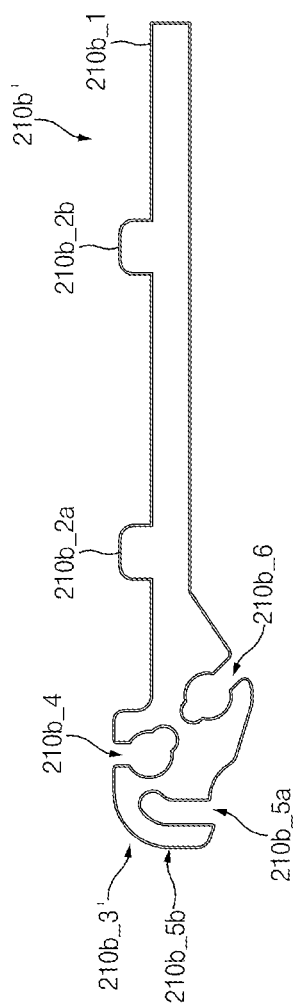
FIG. 7 is a view illustrating another example of a rotary bar applied to an electronic device according to various example embodiments.

FIG. 7 is a view illustrating another example of the rotary bar applied to the electronic device according to various embodiments.

Referring to FIGS. 6 and 7, a modified rotary bar 210b' according to an embodiment may include the second rotary bar body 210b_1, the third protrusion 210b_2a, the fourth protrusion 210b_2b, a modified header 210b_3', the first connection shaft insertion recess 210b_4, a second connection shaft insertion recess 210b_6, a thirteenth opening 210b_5a, and an elastic member 210b_5b. The second rotary bar body 210b_1, the third protrusion 210b_2a, and the fourth protrusion 210b_2b may have configurations that are the same as or similar to those of the second rotary bar body 210b_1, the third protrusion 210b_2a, and the fourth protrusion 210b_2b, which have been described above in FIG. 6. Furthermore, the first connection shaft insertion recess 210b_4 and the second connection shaft insertion recess 210b_6 may have configurations that are the same as or similar to those of the first connection shaft insertion recess 210b_4 and the second connection shaft insertion recess 210b_6, which have been described above in FIG. 6.

The modified header 210b_3' may include the elastic member 210b_5b, at least a portion of which is spaced apart from the second rotary bar body 210b_1 by the thirteenth opening 210b_5a that is opened in the −z axis direction. The elastic member 210b_5b may extend from a periphery of the first connection shaft insertion recess 210b_4 in the x axis direction by a specific length and then extends in the −z axis direction to be formed in a hook shape. Accordingly, a −z axis periphery of the elastic member 210b_5b may be spaced apart from the second rotary bar body 210b_1 by a width of the thirteenth opening 210b_5a whereby different elastic forces may be exerted for areas of the elastic member 210b_5b. For example, a distance, by which one area of a periphery of the elastic member 210b_5b in the z axis direction is bent, may be shorter than a distance, by which one area of a periphery of the elastic member 210b_5b in the −z axis direction is bent.

Figure 8:
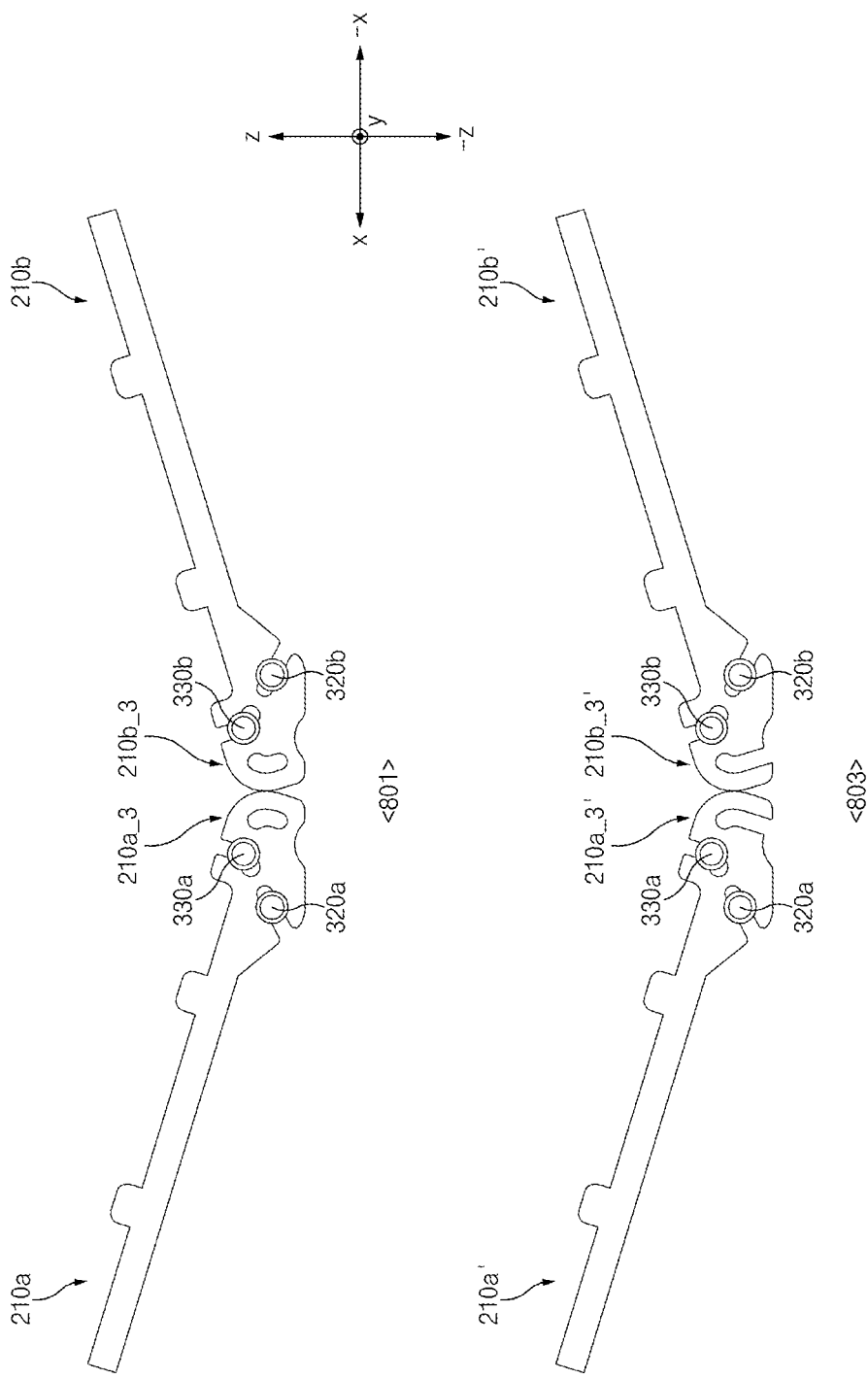
FIG. 8 is a view illustrating an example of contact states of rotary bars according to various example embodiments.

FIG. 8 is a view illustrating an example of contact states of the rotary bars according to various embodiments.

Referring to FIGS. 1, 4, and 8, as in state 801, the electronic device 100 may include the first rotary bar 210a and the second rotary bar 210b, which have been described above, and may include the first connection shaft 320a inserted into the first rotary bar 210a, the third connection shaft 330a, the second connection shaft 320b inserted into the second rotary bar 210b, and the fourth connection shaft 330b. The first rotary bar 210a and the second rotary bar 210b may be coupled to the first rotary member 211 and the second rotary member 212, respectively, and may be disposed in a state, in which they are inclined by a specific angle with respect to the x axis as illustrated in correspondence to rotations of the first rotary member 211 and the second rotary member 212. The first header 210a_3 of the first rotary bar 210a and the second header 210b_3 of the second rotary bar 210b may at least partially contact each other as illustrated. Then, as the first header 210a_3 exerts an elastic force in the −x axis direction and the second header 210b_3 exerts an elastic force in the x axis direction, frictional force may be generated at contact portions of the first header 210a_3 and the second header 210b_3. Due to the frictional forces generated between the first header 210a_3 and the second header 210b_3, the electronic device 100 may provide a free-stop state, in which the first rotary member 211 connected to the first rotary bar 210a and the second rotary member 212 connected to the second rotary bar 210b stop at a specific angle.

According to various embodiments, as in state 803 at least a portion of the link hinge structure may include a first modified rotary bar 210a' and the second modified rotary bar 210b', which have been described in FIG. 7, and may include the first connection shaft 320a inserted into the first modified rotary bar 210a', the third connection shaft 330a, the second connection shaft 320b inserted into the second modified rotary bar 210b', and the fourth connection shaft 330b. The first modified rotary bar 210a' and the second modified rotary bar 210b' may be coupled to the first rotary member 211 and the second rotary member 212, respectively, and may be disposed in a state, in which they are inclined by a specific angle with respect to the x axis as illustrated in correspondence to rotations of the first rotary member 211 and the second rotary member 212. A first modified header 210a_3' of the first modified rotary bar 210a' and the second modified header 210b_3' of the second modified rotary bar 210b' may at least partially contact each other as illustrated. Then, as the first modified header 210a_3' exerts an elastic force in the −x axis direction and the second modified header 210b_3' exerts an elastic force in the x axis direction, frictional force may be generated at contact portions of the first modified header 210a_3' and the second modified header 210b_3'. As compared with the headers described in state 801, the first modified header 210a_3' and the second modified header 210b_3' include elastic members, sides of which are separated from the bodies, and the contact areas may become larger. Due to the frictional forces generated between the first modified header 210a_3' and the second modified header 210b_3', the electronic device 100 may provide a free-stop state, in which the first rotary member 211 connected to the first modified rotary bar 210a' and the second rotary member 212 connected to the second modified rotary bar 210b' stop at a specific angle.

Figure 9:
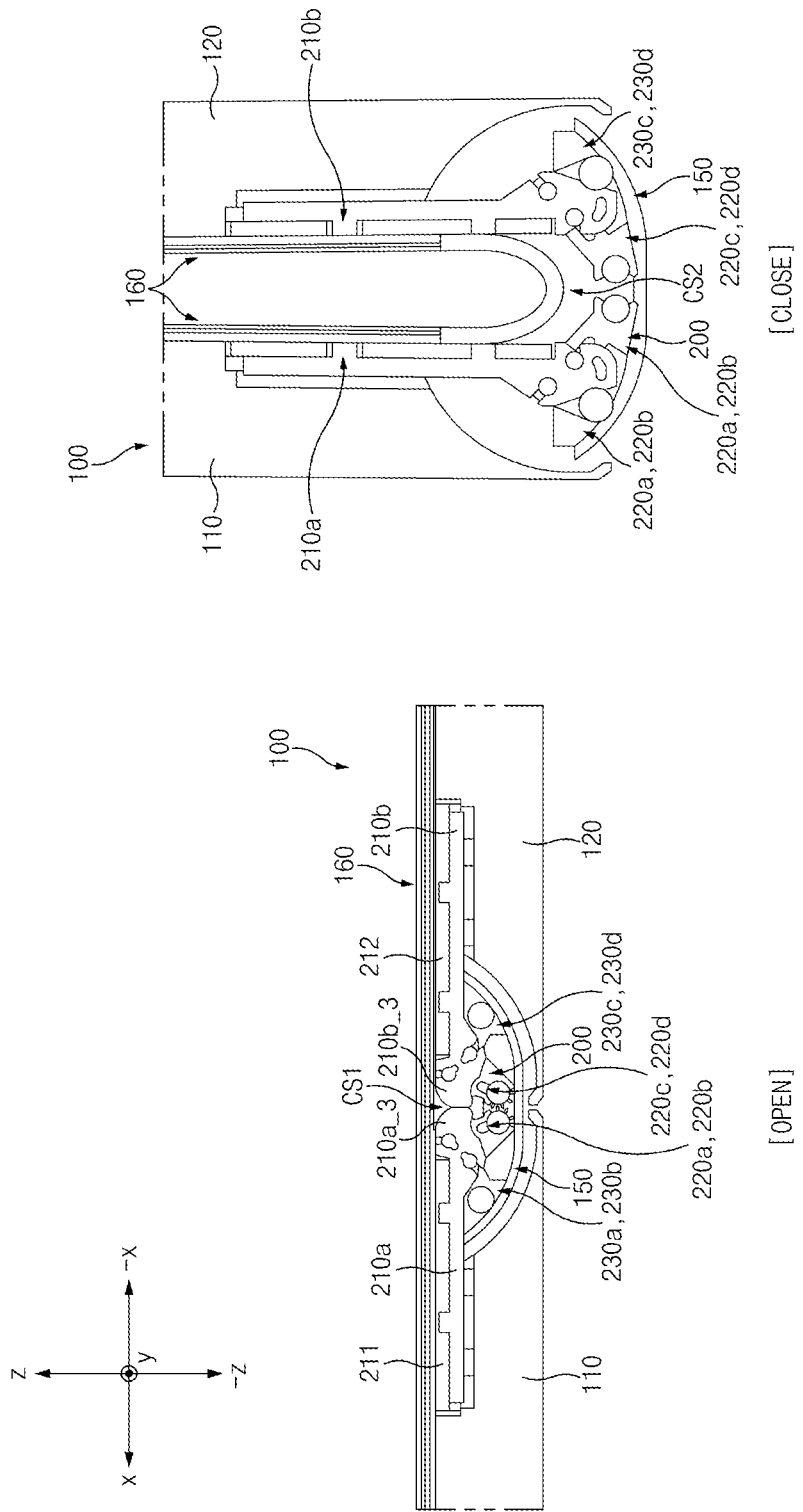
FIG. 9 is a view illustrating an example of space changes for states of an electronic device according to various example embodiments.

FIG. 9 is a view illustrating an example of space changes for states of the electronic device according to various embodiments.

Referring to FIGS. 4 and 9, at least a portion of the electronic device 100 according to an embodiment may include the display 160, the first housing 110 and the second housing 120 disposed on a lower side (e.g., the −z axis direction) of the display 160, and the link hinge structure 200 coupled to the first housing 110 and the second housing 120 with reference to the z axis in the unfolded (open) state. The link hinge structure 200 may be disposed such that at least portions of the first header 210a_3 of the first rotary bar 210a, to which the first rotary member 211 is coupled, and the second header 210b_3 of the second rotary bar 210b, to which the second rotary member 212 is coupled, face each other while contacting each other with respect to the x axis or the −x axis. As at least portions of the first header 210a_3 and the second header 210b_3 in the z axis are rounded, a first empty space CS1 may be formed between the first header 210a_3 and the second header 210b_3, and the display 160. Except for the first empty space CS1, the link hinge structure 200 is disposed to support a rear surface of the display 160. When the electronic device 100 is in the unfolded state, one side of the first housing 110 and one side of the second housing 120 may be disposed to face each other with respect to the x axis, and in correspondence, at least a portion of a central part of the hinge housing 150 may be covered by the first housing 110 and the second housing 120.

At least a portion of the electronic device 100 according to an embodiment may be disposed such that the central part of the display 160 is folded with respect to the z axis in the folded state (or the close state). In correspondence, the first housing 110 connected to the first rotary member 211 and the second housing 120 connected to the second rotary member 212 may be disposed in parallel to each other with respect to the z axis, and at least a portion of the central part of the hinge housing 150 may be disposed to be exposed to an outside. At least a portion of the central part of the link hinge structure 200 may define a second empty space CS2 as illustrated in correspondence to the folded state of the electronic device 100. The second empty space CS2 may have a sufficient space such that the display 160, the central part of which is folded, is prevented from contacting the link hinge structure 200 because the rotary bars 210a and 210b, the support bars 230a, 230b, 230c, and 230d, and the interlocking gear bars 220a, 220b, 220c, 220d are disposed in U shapes. Accordingly, even when an external pressure is applied to the electronic device 100, for example, even when the electronic device 100 drops, the central part of the display 160 and the link hinge structure 200 may be prevented from contacting each other and thus damage to the display 160 may be prevented or reduced.

Figure 10:
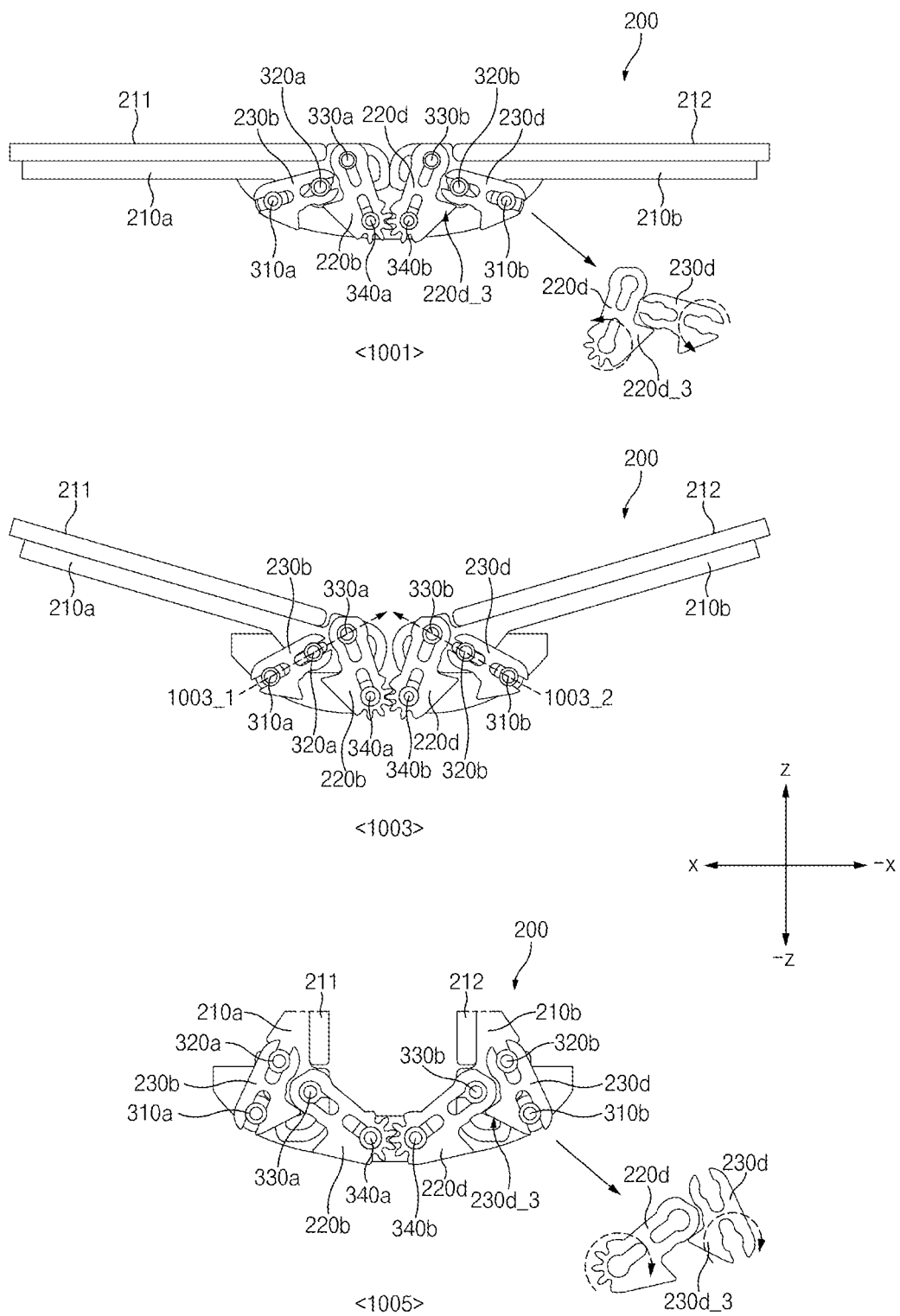
FIG. 10 is a view illustrating states of a link hinge structure for states of an electronic device according to various example embodiments.

FIG. 10 is a view illustrating states of the link hinge structure for states of the electronic device according to various embodiments.

Referring to FIGS. 4, 5, and 10, the link hinge structure 200 of the electronic device according to an embodiment may be in the unfolded state as in state 1001. The link hinge structure 200 in the unfolded state may be disposed such that the first rotary bar 210a and the second rotary bar 210b are disposed in parallel to each other with respect to the z axis. The link hinge structure 200 in the unfolded state may be disposed such that one side of the second support bar 230b contacts the stopper of the second interlocking gear bar 220b and one side of the fourth support bar 230d contacts the stopper 220d_3 of the fourth interlocking gear bar 220d. Additionally, one side of the first support bar 230a may contact the stopper of the first interlocking gear bar 220a and one side of the third support bar 230c may contact the stopper of the third interlocking gear bar 220c. Accordingly, the stoppers disposed in the first interlocking gear bar 220a and the second interlocking gear bar 220b may support sides of the first support bar 230a and the second support bar 230b such that the first rotary bar 210a connected to the first connection shaft 320a is prevented from being further rotated in the counterclockwise direction, and the stoppers (e.g., 220d_3) disposed in the third interlocking gear bar 220c and the fourth interlocking gear bar 220d may support sides of the third support bar 230c and the fourth support bar 230d such that the second rotary bar 210b connected to the second connection shaft 320b is prevented from being further rotated in the clockwise direction. While the first rotary bar 210a is rotated in the counterclockwise direction, the first support bar 230a, the second support bar 230b, the first interlocking gear bar 220a, and the second interlocking gear bar 220b may be rotated in the clockwise direction, and while the second rotary bar 210b is rotated in the clockwise direction, the third support bar 230c, the fourth support bar 230d, the third interlocking gear bar 220c, and the fourth interlocking gear bar 220d may be rotated in the counterclockwise direction.

The link hinge structure 200 of the electronic device according to an embodiment may be in a state (e.g., a free-stop state), in which it stops at a specific angle. The link hinge structure 200 in the free-stop state may be disposed such that angles of the first rotary bar 210a and the second rotary bar 210b with respect to the x axis is smaller than 180 degrees and larger than 0 degrees. The link hinge structure 200 in the free-stop state may be disposed such that the first fixing shaft 310a, the first connection shaft 320a, and the third connection shaft 330a are disposed to be positioned on an imaginary straight line 1003_1 (a change point) and the second fixing shaft 310b, the second connection shaft 320b, and the fourth connection shaft 330b are positioned on an imaginary straight line 1003_2. While some shafts in the link hinge structure 200 are disposed on the imaginary straight lines 1003_1 and 1003_2 as described above, the frictional forces applied in the free-stop state of the first rotary bar 210a and the second rotary bar 210b may be the highest (e.g., a state, in which a compression degree due to contact of the detents (or the first header 210a_3 and the second header 210b_3) is maximal). Furthermore, while some shafts in the link hinge structure 200 are disposed on the imaginary straight lines 1003_1 and 1003_2, the free-stop state (e.g., a state, in which a specific angle (e.g., the angle between the first housing 110 and the second housing 120 is smaller than 180 degrees and larger than 0 degrees)) of the electronic device 100 is most stable. As the electronic device is rotated, the electronic device may provide a detent feeling due to an abrupt change in the compression degree of the detent part while the straight line state (or an equilibrium state) of the link hinge structure 200 is changed or a change point passes, and a maintenance force in the unfolded state may be achieved as equilibrium of the compression degree of the detent part and the force is made by the stoppers.

The link hinge structure 200 of the electronic device according to an embodiment may be in the folded state as in state 1005. The link hinge structure 200 in the folded state may be disposed such that the first rotary bar 210a and the second rotary bar 210b are disposed in parallel to each other with respect to the z axis. The link hinge structure 200 in the folded state may be disposed such that one side of the second interlocking gear bar 220b contacts the stopper of the second support bar 230b and one side of the fourth interlocking gear bar 220d contacts the stopper (e.g., 230d_3) of the fourth support bar 230d. Additionally, one side of the first interlocking gear bar may contact the stopper of the first support bar, and one side of the third interlocking gear bar may contact the stopper of the third support bar. Accordingly, the stoppers disposed in the first support bar 230a and the second support bar 230b may support sides of the first interlocking gear bar 220a and the second interlocking gear bar 220b such that the first rotary bar 210a connected to the third connection shaft 330a is prevented from being further rotated in the clockwise direction, and the stoppers disposed in the third support bar 230c and the fourth support bar 230d may support sides of the third interlocking gear bar 220c and the fourth interlocking gear bar 220d such that the second rotary bar 210b connected to the fourth connection shaft 330b is prevented from being further rotated in the counterclockwise direction. While the first rotary bar 210a is rotated in the clockwise direction, the first support bar 230a, the second support bar 230b, the first interlocking gear bar 220a, and the second interlocking gear bar 220b may be rotated in the counterclockwise direction, and while the second rotary bar 210b is rotated in the counterclockwise direction, the third support bar 230c, the fourth support bar 230d, the third interlocking gear bar 220c, and the fourth interlocking gear bar 220d may be rotated in the clockwise direction.

Figure 11:
FIG. 11 is a view illustrating an example of other forms of a link hinge structure according to various example embodiments.

FIG. 11 is a view illustrating an example of other forms of the link hinge structure according to various embodiments.

Referring to FIG. 11, according to an embodiment, as in state 1101, the first link hinge structure 200 may include the first rotary member 211, the second rotary member 212, the first fixing bracket 221, the second fixing bracket 222, and the one link structure 300.

According to various embodiments, as in state 1103, a second link hinge structure 400 may include a first rotary member 411, a second rotary member 412, a first fixing bracket 421, a second fixing bracket 422, a first link structure 300a, and a second link structure 300b. The first rotary member 411 may have an area that is larger than that of the first rotary member 211 of the first link hinge structure 200. Furthermore, the second rotary member 412 may have an area that is larger than that of the second rotary member 212 of the first link hinge structure 200. According to various embodiments, the first rotary member 411 and the second rotary member 412 may include holes, the number of which corresponds to the plurality of protrusions formed in the first link structure 300a and the second link structure 300b such that the protrusions may be inserted into the holes. For example, the first rotary member 411 and the second rotary member 412 may include four holes, respectively. The first link structure 300a and the second link structure 300b may have a structure and a size that are the same as or similar to those of the link structure 300 disposed in the first link hinge structure 200. According to various embodiments, the first link structure 300a and the second link structure 300b include the rotary bars, the support bars, and the interlocking gear bars like the above-described link structure 300, and may share the fixing shafts and the connection shafts. For example, the fixing shafts and the connection shafts disposed in the first link structure 300a may be coupled to the rotary bars, the support bars, and the interlocking gear bars of the adjacent second link structure 300b.

According to various embodiments, as in state 1105, a third link hinge structure 500 may include a first rotary member 511, a second rotary member 512, a first fixing bracket 521, a second fixing bracket 522, the first link structure 300a, the second link structure 300b, and a third link structure 300c. The first rotary member 511 and the second rotary member 512 may have a relatively wide surface in the z axis direction as compared with the first rotary member 411 and the second rotary member 412 described in the second link hinge structure 400, and may include a plurality of holes, into which the protrusions disposed in the link structures 300a, 300b, and 300c are disposed. For example, when the link structures 300a, 300b, and 300c include two protrusions, the first rotary member 511 and the second rotary member 512 may include six holes, respectively. The link structures 300a, 300b, and 300c may have a size and a structure that are similar to those of the link structure 300 described in the first link hinge structure 200. According to various embodiments, the link structures 300a, 300b, and 300c include the rotary bars, the support bars, and the interlocking gear bars like the above-described link structure 300, and may share the fixing shafts and the connection shafts. For example, the fixing shafts and the connection shafts disposed in the first link structure 300a may be coupled to the rotary bars, the support bars, and the interlocking gear bars of the adjacent second link structure 300b and the third link structure 300c.

According to various embodiments, as in state 1107, a fourth link hinge structure 600 may include a first rotary member 611, a second rotary member 612, a first fixing bracket 621, a second fixing bracket 622, a third fixing bracket 623, the first link structure 300a, and the second link structure 300b. In the fourth link hinge structure 600, the link structures 300a and 300b may be alternately disposed between the fixing brackets 621, 622, and 622. For example, the first link structure 300a may be disposed between the first fixing bracket 621 and the third fixing bracket 623, and the second link structure 300b may be disposed between the third fixing bracket 623 and the second fixing bracket 622. Because the link structures 300a and 300b are spaced apart from each other while the third fixing bracket 623 being interposed therebetween, holes corresponding to the locations of the protrusions formed in the link structures 300a and 300b may be disposed in the first rotary member 611 and the second rotary member 612 to be spaced apart from each other. For example, in the first rotary member 611, the holes, into which the protrusions of the first link structure 300a are inserted, and the holes, into which the protrusions of the second link structure 300b are inserted, may be disposed to be spaced apart from each other. According to various embodiments, the holes coupled to the housing may be disposed between the holes, into which the protrusions are inserted. For example, in the first rotary member 611, at least one hole used to couple the first housing and the first rotary member 611 may be disposed between the holes, into which the protrusions of the first link structure 300a are inserted, and the hole, into which the protrusions of the second link structure 300b are inserted. Similarly, in the second rotary member 612, at least one hole used to couple the second housing and the second rotary member 612 may be disposed between the holes, into which the protrusions of the first link structure 300a are inserted, and the hole, into which the protrusions of the second link structure 300b are inserted.

According to various embodiments, as in state 1109, a fifth link hinge structure 700 may include a first rotary member 711, a second rotary member 712, a first fixing bracket 721, a second fixing bracket 722, a third fixing bracket 723, a fourth fixing bracket 724, the first link structure 300a, the second link structure 300b, and the third link structure 300c. In the above-described fifth link hinge structure 700, the first link structure 300a may be disposed between the first fixing bracket 721 and the second fixing bracket 722, the second link 300b may be disposed between the second fixing bracket 722 and the third fixing bracket 723, and the third link structure 300c may be disposed between the third fixing bracket 723 and the fourth fixing bracket 724. Accordingly, the first rotary member 721 and the second rotary member 722 may have a wider z axis surface as compared with the first rotary member 611 and the second rotary member 612 of the fourth link hinge structure 600 that may be coupled to the protrusions of the link structures, which are disposed to be spaced apart from each other while the fixing brackets being interposed therebetween.

According to various embodiments, a link hinge structure 200 may include a first rotary bar 210*a* connected, directly or indirectly, to a first rotary support member 211, a second rotary bar 210*b* connected, directly or indirectly, to a second rotary support member 212, a first interlocking gear bar 220*a* and a second interlocking gear bar 220*b* coupled to the first rotary bar 210*a* and each including an interlocking gear structure, a first support bar 230*a* and a second support bar 230*b* connected, directly or indirectly, to the first rotary bar 210*a* and that supports rotation of the first rotary bar 210*a*, a third interlocking gear bar 220*c* and a fourth interlocking gear bar 220*d* coupled to the second rotary bar 210*c* and each including an interlocking gear structure, wherein the third interlocking gear bar 220*c* is coupled to the first interlocking gear bar 220*a* and the fourth interlocking gear bar 220*d* is coupled to the second interlocking gear bar 220*a*, a third support bar 230*c* and a fourth support bar 230*d* connected, directly or indirectly, to the second rotary bar 210*b* and that supports rotation of the second rotary bar 210*b*, a first fixing shaft 110*a* that fixes the first support bar 230*a* and the second support bar 230*b*, a second fixing shaft 110*b* that fixes the third support bar 230*c* and the fourth support bar 230*d*, a third fixing shaft 340*a* that fixes the first interlocking gear bar 220*a* and the second interlocking gear bar 220*b*, a fourth fixing shaft 340*b* that fixes the third interlocking gear bar 220*c* and the fourth interlocking gear bar 220*d*, a first connection shaft 120*a* connecting the first support bar 230*a* and the first rotary bar 210*a*, and the second support bar 230*b* and the first rotary bar 210*a*, a second connection shaft 120*b* connecting the third support bar 230*c* and the second rotary bar 210*b*, and the fourth support bar 230*d* and the second rotary bar 210*b*, a third connection shaft 130*a* connecting the first rotary bar 210*a* and the first interlocking gear bar 220*a*, and the first rotary bar 210*a* and the second interlocking gear bar 220*b*, and a fourth connection shaft 130*b* connecting the second rotary bar 210*b* and the third interlocking gear bar 220*b*, and the second rotary bar 210*b* and the fourth interlocking gear bar 220*d*, each of the third fixing shaft 340*a* and the fourth fixing shaft 340*b* may include a column part 3402, and rail bosses 340*a*_1, 340*b*_1 protruding from an outer peripheral surface of the column part 3402, and each of the first interlocking gear bar and the second interlocking gear bar may include a first shaft insertion hole for insertion of the third fixing shaft, and a first hole extension part extending from the first shaft insertion hole and into which a first rail boss formed in the third fixing shaft is inserted.

According to various embodiments, each of the third interlocking gear bar and the fourth interlocking gear bar may include a second shaft insertion hole for insertion of the fourth fixing shaft, and a second hole extension part extending from the second shaft insertion hole and into which a second rail boss formed in the fourth fixing shaft is inserted.

According to various embodiments, one end of the first rotary bar and one end or the second rotary bar may be disposed to exert elastic forces in directions that face each other while contacting each other, in an unfolded state, in which the first rotary member and the second rotary member are disposed to face the same direction or when an angle defined by the first rotary member and the second rotary member is an obtuse angle within a specific angle range.

According to various embodiments, each of the first rotary bar and the second rotary bar may include a first opening, into which the third connection shaft or the fourth connection shaft is inserted, and a second opening extending from the first opening, in which the third connection shaft or the fourth connection shaft is seated, and having a size that is equal to or smaller than a diameter of the third connection shaft or the fourth connection shaft, and the first opening may have a size that is smaller than that of the second opening.

According to various embodiments, each of the first rotary bar and the second rotary bar may include a third opening extending from the second opening and having a size that is smaller than that of the second opening.

According to various embodiments, each of the first rotary bar and the second rotary bar may include a fourth opening, into which the first connection shaft or the second connection shaft is inserted, and a fifth opening extending from the fourth opening, in which the first connection shaft or the second connection shaft is seated, and having a size that is equal to or smaller than a diameter of the first connection shaft or the second connection shaft, and the fourth opening may have a size that is smaller than that of the fifth opening.

According to various embodiments, each of the first rotary bar and the second rotary bar may include a sixth opening extending from the fifth opening and having a size that is smaller than that of the fifth opening.

According to various embodiments, each of the first to fourth support bars may include seventh opening, into which a connection shaft is inserted, and an eighth opening extending from the seventh opening, in which the connection shaft is seated, and having a size that is equal to or smaller than a diameter of the connection shaft, and the seventh opening may have a size that is smaller than that of the eighth opening.

According to various embodiments, each of the first to fourth support bars may include a ninth opening extending from the eighth opening and having a size that is smaller than that of the eighth opening.

According to various embodiments, each of the first to fourth support bars may include a tenth opening, into which a fixing shaft is inserted, and an eleventh opening extending from the tenth opening, in which the fixing shaft is seated, and having a size that is equal to or smaller than a diameter of the fixing shaft, and the tenth opening may have a size that is smaller than that of the eleventh opening.

According to various embodiments, each of the first to fourth support bars may include a twelfth opening extending from the eleventh opening and having a size that is smaller than that of the eleventh opening.

According to various embodiments, each of the first to fourth interlocking gear bars may include a third shaft insertion hole, into which a connection shaft is inserted, a third hole extension part extending from the third shaft insertion hole, and a gear pattern engaged with another interlocking gear bar.

According to various embodiments, each of the first rotary bar and the second rotary bar may include a first header and a second header that face each other in an unfolded state, in which the first rotary member and the second rotary member are disposed to face the same direction, and each of the first header and the second header may include a hole or a recess.

According to various embodiments, each of the first to fourth interlocking gear bars may include a first stopper that contacts at least some of the first to fourth support bars to restrict counterclockwise rotation of the first rotary member or clockwise rotation of the second rotary member in an unfolded state, in which the first rotary member and the second rotary member are disposed to face the same direction.

According to various embodiments, each of the first to fourth support bars may include a second stopper that contacts at least some of the first to fourth interlocking gear bars to restrict clockwise rotation of the first rotary member or counterclockwise rotation of the second rotary member in a folded state, in which the first rotary member and the second rotary member are disposed in a direction, in which they face each other.

According to various embodiments, a plurality of plate members having the same cross-section may be formed in at least one of the first rotary bar and the second rotary bar to overlap each other.

According to various embodiments, a plurality of plate members having the same cross-section may be formed in at least one of the first to fourth support bars to overlap each other.

According to various embodiments, a plurality of plate members having the same cross-section may be formed in at least one of the first to fourth interlocking gear bars to overlap each other.

According to various embodiments, frictional forces applied to contact portions of the first rotary bar and the second rotary bar may become maximal in a state, in which the first fixing shaft, the first connection shaft, and the third connection shaft are laid on one straight line.

According to various embodiments, an electronic device may include a display, a first housing that supports one side of the display, a second housing that supports an opposite side of the display, and a link hinge structure connecting the first housing and the second housing, the link hinge structure includes a first rotary bar 210a connected, directly or indirectly, to a first rotary member 211, a second rotary bar 210b connected, directly or indirectly, to a second rotary member 212, a first interlocking gear bar 220a and a second interlocking gear bar 220b coupled to the first rotary bar 210a and each including an interlocking gear structure, a first support bar 230a and a second support bar 230b connected, directly or indirectly, to the first rotary bar 210a and that supports rotation of the first rotary bar 210a, a third interlocking gear bar 220c and a fourth interlocking gear bar 220d coupled to the second rotary bar 210c and each including an interlocking gear structure, wherein the third interlocking gear bar 220c is coupled to the first interlocking gear bar 220a and the fourth interlocking gear bar 220d is coupled to the second interlocking gear bar 220a, a third support bar 230c and a fourth support bar 230d connected, directly or indirectly, to the second rotary bar 210b and that supports rotation of the second rotary bar 210b, a first fixing shaft 110a that fixes the first support bar 230a and the second support bar 230b, a second fixing shaft 110b that fixes the third support bar 230c and the fourth support bar 230d, a third fixing shaft 340a that fixes the first interlocking gear bar 220a and the second interlocking gear bar 220b, a fourth fixing shaft 340b that fixes the third interlocking gear bar 220c and the fourth interlocking gear bar 220d, a first connection shaft 120a connecting, directly or indirectly, the first support bar 230a and the first rotary bar 210a, and the second support bar 230b and the first rotary bar 210a, a second connection shaft 120b connecting, directly or indirectly, the third support bar 230c and the second rotary bar 210b, and the fourth support bar 230d and the second rotary bar 210b, a third connection shaft 130a connecting, directly or indirectly, the first rotary bar 210a and the first interlocking gear bar 220a, and the first rotary bar 210a and the second interlocking gear bar 220b, and a fourth connection shaft 130b connecting, directly or indirectly, the second rotary bar 210b and the third interlocking gear bar 220b, and the second rotary bar 210b and the fourth interlocking gear bar 220d, each of the third fixing shaft 340a and the fourth fixing shaft 340b may include a column part 3402, and rail bosses 340a_1, 340b_1 protruding from an outer peripheral surface of the column part 3402, each of the first interlocking gear bar and the second interlocking gear bar may include a first shaft insertion hole for insertion of the third fixing shaft, and a first hole extension part extending from the first shaft insertion hole and into which a first rail boss formed in the third fixing shaft is inserted, and each of the third interlocking gear bar and the fourth interlocking gear bar may include a second shaft insertion hole for insertion of the fourth fixing shaft, and a second hole extension part extending from the second shaft insertion hole and into which a second rail boss formed in the fourth fixing shaft is inserted.

Each of the components (e.g., a module or a program) according to various embodiments may include a single or a plurality of entities, and some of the corresponding sub-components may be omitted or another sub-component may be further included in various embodiments. Alternatively or additionally, some components (e.g., a module or a program) may be integrated into one entity to perform functions performed by the corresponding components before the integration in the same way or similarly. The operations performed by a module, a program module, or another component according to various embodiments may be executed sequentially, in parallel, repeatedly, or heuristically, or at least some operations may be executed in another sequence or may be omitted, or another operation may be added.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. A link hinge structure comprising:
    a first rotary bar connected to a first rotary support member;
    a second rotary bar connected to a second rotary support member;
    a first interlocking gear bar and a second interlocking gear bar coupled to the first rotary bar and each including an interlocking gear structure;
    a first support bar and a second support bar connected to the first rotary bar and configured to support rotation of the first rotary bar;
    a third interlocking gear bar and a fourth interlocking gear bar coupled to the second rotary bar and each including an interlocking gear structure, wherein the third interlocking gear bar is coupled to the first interlocking gear bar and the fourth interlocking gear bar is coupled to the second interlocking gear bar;
    a third support bar and a fourth support bar connected to the second rotary bar and configured to support rotation of the second rotary bar;
    a first fixing shaft configured to fix the first support bar and the second support bar;
    a second fixing shaft configured to fix the third support bar and the fourth support bar;

a third fixing shaft configured to fix the first interlocking gear bar and the second interlocking gear bar;
a fourth fixing shaft configured to fix the third interlocking gear bar and the fourth interlocking gear bar;
a first connection shaft configured to connect the first support bar and the first rotary bar, and the second support bar and the first rotary bar;
a second connection shaft configured to connect the third support bar and the second rotary bar, and the fourth support bar and the second rotary bar;
a third connection shaft configured to connect the first rotary bar and the first interlocking gear bar, and the first rotary bar and the second interlocking gear bar; and
a fourth connection shaft configured to connect the second rotary bar and the third interlocking gear bar, and the second rotary bar and the fourth interlocking gear bar,
wherein each of the third fixing shaft and the fourth fixing shaft includes:
a column part; and
rail bosses protruding from an outer peripheral surface of the column part, and
wherein each of the first interlocking gear bar and the second interlocking gear bar includes:
a first shaft insertion hole configured for insertion of the third fixing shaft; and
a first hole extension part extending from the first shaft insertion hole and into which a first rail boss formed in the third fixing shaft is inserted.

2. The link hinge structure of claim 1, wherein each of the third interlocking gear bar and the fourth interlocking gear bar includes:
a second shaft insertion hole configured for insertion of the fourth fixing shaft; and
a second hole extension part extending from the second shaft insertion hole and into which a second rail boss formed in the fourth fixing shaft is configured to be inserted.

3. The link hinge structure of claim 1, wherein one end of the first rotary bar and one end of the second rotary bar are disposed to exert elastic forces in directions that face each other while contacting each other, in an unfolded state, in which the first rotary support member and the second rotary support member are disposed to face the same direction and/or when an angle defined by the first rotary support member and the second rotary support member is an obtuse angle within a specific angle range.

4. The link hinge structure of claim 1, wherein each of the first rotary bar and the second rotary bar includes:
a first opening, into which the third connection shaft or the fourth connection shaft is configured to be inserted; and
a second opening extending from the first opening, in which the third connection shaft or the fourth connection shaft is seated, and having a size that is equal to or smaller than a diameter of the third connection shaft or the fourth connection shaft, and
wherein the first opening has a size that is smaller than that of the second opening.

5. The link hinge structure of claim 4, wherein each of the first rotary bar and the second rotary bar includes:
a third opening extending from the second opening and having a size that is smaller than that of the second opening.

6. The link hinge structure of claim 1, wherein each of the first rotary bar and the second rotary bar includes:

a fourth opening, into which the first connection shaft or the second connection shaft is configured to be inserted; and
a fifth opening extending from the fourth opening, in which the first connection shaft or the second connection shaft is seated, and having a size that is equal to or smaller than a diameter of the first connection shaft or the second connection shaft, and
wherein the fourth opening has a size that is smaller than that of the fifth opening.

7. The link hinge structure of claim 6, wherein each of the first rotary bar and the second rotary bar includes:
a sixth opening extending from the fifth opening and having a size that is smaller than that of the fifth opening.

8. The link hinge structure of claim 1, wherein each of the first to fourth support bars includes:
a seventh opening, into which a connection shaft is configured to be inserted; and
an eighth opening extending from the seventh opening, in which the connection shaft is seated, and having a size that is equal to or smaller than a diameter of the connection shaft, and
wherein the seventh opening has a size that is smaller than that of the eighth opening.

9. The link hinge structure of claim 8, wherein each of the first to fourth support bars includes:
a ninth opening extending from the eighth opening and having a size that is smaller than that of the eighth opening.

10. The link hinge structure of claim 1, wherein each of the first to fourth support bars includes:
a tenth opening, into which a fixing shaft is configured to be inserted; and
an eleventh opening extending from the tenth opening, in which the fixing shaft is seated, and having a size that is equal to or smaller than a diameter of the fixing shaft, and
wherein the tenth opening has a size that is smaller than that of the eleventh opening.

11. The link hinge structure of claim 10, wherein each of the first to fourth support bars includes:
a twelfth opening extending from the eleventh opening and having a size that is smaller than that of the eleventh opening.

12. The link hinge structure of claim 1, wherein each of the first to fourth interlocking gear bars includes:
a third shaft insertion hole, into which a connection shaft is configured to be inserted;
a third hole extension part extending from the third shaft insertion hole; and
a gear pattern engaged with another interlocking gear bar.

13. The link hinge structure of claim 1, wherein each of the first rotary bar and the second rotary bar includes:
a first header and a second header that are configured to face each other in an unfolded state, in which the first rotary support member and the second rotary support member are disposed to face the same direction, and
wherein each of the first header and the second header includes:
a hole and/or a recess.

14. The link hinge structure of claim 1, wherein each of the first to fourth interlocking gear bars includes:
a first stopper configured to contact at least some of the first to fourth support bars to restrict counterclockwise rotation of the first rotary support member and/or clockwise rotation of the second rotary support member in an unfolded state, in which the first rotary support member and the second rotary support member are disposed to face the same direction.

15. The link hinge structure of claim 1, wherein each of the first to fourth support bars includes:
a second stopper configured to contact at least some of the first to fourth interlocking gear bars and configured to restrict clockwise rotation of the first rotary support member and/or counterclockwise rotation of the second rotary support member in a folded state, in which the first rotary support member and the second rotary support member are disposed in a direction, in which they face each other.

16. The link hinge structure of claim 1, wherein a plurality of plate members having the same cross-section are formed in at least one of the first rotary bar and the second rotary bar and configured to overlap each other.

17. The link hinge structure of claim 1, wherein a plurality of plate members having the same cross-section are formed in at least one of the first to fourth support bars and configured to overlap each other.

18. The link hinge structure of claim 1, wherein a plurality of plate members having the same cross-section are formed in at least one of the first to fourth interlocking gear bars and configured to overlap each other.

19. The link hinge structure of claim 1, wherein frictional forces applied to contact portions of the first rotary bar and the second rotary bar become maximal in a state, in which the first fixing shaft, the first connection shaft, and the third connection shaft are laid on one straight line.

20. An electronic device comprising:
a display;
a first housing configured to support one side of the display;
a second housing configured to support an opposite side of the display; and
a link hinge structure connecting at least the first housing and the second housing,
wherein the link hinge structure includes:
a first rotary bar connected to a first rotary support member;
a second rotary bar connected to a second rotary support member;
a first interlocking gear bar and a second interlocking gear bar coupled to the first rotary bar and each including an interlocking gear structure;
a first support bar and a second support bar connected to the first rotary bar and configured to support rotation of the first rotary bar;
a third interlocking gear bar and a fourth interlocking gear bar coupled to the second rotary bar and each including an interlocking gear structure, wherein the third interlocking gear bar is coupled to the first interlocking gear bar and the fourth interlocking gear bar is coupled to the second interlocking gear bar;
a third support bar and a fourth support bar connected to the second rotary bar and configured to support rotation of the second rotary bar;
a first fixing shaft configured to fix the first support bar and the second support bar;
a second fixing shaft configured to fix the third support bar and the fourth support bar;
a third fixing shaft configured to fix the first interlocking gear bar and the second interlocking gear bar;
a fourth fixing shaft configured to fix the third interlocking gear bar and the fourth interlocking gear bar;
a first connection shaft configured to connect the first support bar and the first rotary bar, and the second support bar and the first rotary bar;
a second connection shaft configured to connect the third support bar and the second rotary bar, and the fourth support bar and the second rotary bar;
a third connection shaft configured to connect the first rotary bar and the first interlocking gear bar, and the first rotary bar and the second interlocking gear bar; and
a fourth connection shaft configured to connect the second rotary bar and the third interlocking gear bar, and the second rotary bar and the fourth interlocking gear bar,
wherein each of the third fixing shaft and the fourth fixing shaft includes:
a column part; and
rail bosses protruding from an outer peripheral surface of the column part, and
wherein each of the first interlocking gear bar and the second interlocking gear bar includes:
a first shaft insertion hole configured for insertion of the third fixing shaft; and
a first hole extension part extending from the first shaft insertion hole and into which a first rail boss formed in the third fixing shaft is inserted, and
wherein each of the third interlocking gear bar and the fourth interlocking gear bar includes:
a second shaft insertion hole configured for insertion of the fourth fixing shaft; and
a second hole extension part extending from the second shaft insertion hole and into which a second rail boss formed in the fourth fixing shaft is inserted.

* * * * *